(12) United States Patent
Nojima

(10) Patent No.: US 7,730,445 B2
(45) Date of Patent: Jun. 1, 2010

(54) PATTERN DATA VERIFICATION METHOD FOR SEMICONDUCTOR DEVICE, COMPUTER-READABLE RECORDING MEDIUM HAVING PATTERN DATA VERIFICATION PROGRAM FOR SEMICONDUCTOR DEVICE RECORDED, AND SEMICONDUCTOR DEVICE MANUFACTURING METHOD

(75) Inventor: Shigeki Nojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 11/798,725

(22) Filed: May 16, 2007

(65) Prior Publication Data

US 2008/0022240 A1 Jan. 24, 2008

(30) Foreign Application Priority Data

May 17, 2006 (JP) ............... 2006-137980

(51) Int. Cl.
*G06F 17/50* (2006.01)
(52) U.S. Cl. .......................................... 716/21; 716/19
(58) Field of Classification Search ............... 716/19–21
See application file for complete search history.

(56) References Cited

U.S. PATENT DOCUMENTS 6,077,310 A * 6/2000 Yamamoto et al. ............ 716/19

| | | | |
|---|---|---|---|
| 6,470,489 B1 | 10/2002 | Chang et al. | |
| 7,013,439 B2 * | 3/2006 | Robles et al. | 716/4 |
| 7,149,998 B2 * | 12/2006 | Li | 716/19 |
| 7,278,125 B2 * | 10/2007 | Nojima | 716/5 |
| 2005/0273754 A1 | 12/2005 | Nojima et al. | |

FOREIGN PATENT DOCUMENTS

| JP | 9-319067 | 12/1997 |
|---|---|---|
| JP | 2003-107664 | 4/2003 |
| JP | 2005-084170 | 3/2005 |

OTHER PUBLICATIONS

David M. Newmark et al., "Large Area Optical Proximity Correction Using Pattern Based Corrections", SPIE vol. 2322, Photomask Technology and Management, pp. 374-386, 1994.

* cited by examiner

*Primary Examiner*—Jack Chiang
*Assistant Examiner*—Binh C Tat
(74) *Attorney, Agent, or Firm*—Finnegan, Henderson, Farabow, Garrett & Dunner, L.L.P.

(57) ABSTRACT

A pattern data verification method for a semiconductor device, including extracting, from design data, design data corresponding to an edge portion of a mask pattern to obtain an edge portion of a pattern on a substrate to be processed, when the pattern is obtained on the substrate to be processed by using at least two masks each having the mask pattern corresponding to the design data, setting allowable errors with respect to the extracted design data and the design data which is not extracted, respectively, calculating a pattern formed on the substrate to be processed by using at least one mask by process simulation, and comparing an error between the pattern calculated by the simulation and the design data with the allowable error set for the design data.

14 Claims, 11 Drawing Sheets

Shape of pattern 10 on substrate to be processed 6 formed by using shifter mask 1

Shifter mask
(mask for forming micropattern)

PATTERN DATA VERIFICATION METHOD FOR SEMICONDUCTOR DEVICE, COMPUTER-READABLE RECORDING MEDIUM HAVING PATTERN DATA VERIFICATION PROGRAM FOR SEMICONDUCTOR DEVICE RECORDED, AND SEMICONDUCTOR DEVICE MANUFACTURING METHOD

CROSS-REFERENCE TO RELATED APPLICATIONS

This application is based upon and claims the benefit of priority from prior Japanese Patent Application No. 2006-137980, filed May 17, 2006, the entire contents of which are incorporated herein by reference.

BACKGROUND OF THE INVENTION

1. Field of the Invention

The present invention relates to a lithography step in steps of manufacturing a semiconductor device, and particularly to a pattern data verification method for a semiconductor device for determining whether an allowable error for design data of a pattern formed by using two or more masks falls within an appropriate range by using simulation, a computer-readable recording medium having a pattern data verification program for a semiconductor device recorded, and a semiconductor device manufacturing method for forming a pattern by using two or more masks.

2. Description of the Related Art

In recent years, a manufacturing technique for a semiconductor device has been remarkably developed, and semiconductor devices each having a minimum process size of about 70 nm have been mass-produced. Micropatterning of the semiconductor device has been realized by the remarkable progress of micropattern forming techniques such as a microprocess technique, a photolithography technique, and an etching technique. In a previous generation in which a pattern size of an integrated circuit is sufficiently larger than that in the present generation, a planar shape of a desired integrated circuit pattern formed on a wafer is directly written as a design pattern, and a mask pattern faithful to the design pattern is formed. The mask pattern is transferred onto a wafer by a projection optical system, and an underlying layer to which the mask pattern has been transferred may be etched. In this manner, the integrated circuit pattern almost equal to the designed pattern can be formed on the wafer. However, with the advance of micropatterning of the integrated circuit pattern, a pattern is difficult to be faithfully formed in each manufacturing process of a semiconductor device, which therefore makes it disadvantageously difficult to obtain an integrated circuit pattern of a desired design pattern size.

In particular, in a key lithography process and etching process to achieve micropatterning, a layout or an arrangement of another pattern arranged around a pattern to be formed considerably influences the dimensional accuracy of the pattern to be formed. Therefore, techniques such as a so-called optical proximity correction (OPC) and process proximity correction (PPC) have been developed to avoid the above influence. These techniques appropriately correct a pattern size by adding an auxiliary pattern in advance or increasing or decreasing the width of the pattern to make the size of a processed pattern equal to the values of the desired design pattern. The techniques have been reported by, for example, Jpn. Pat. Appln. KOKAI Publication Nos. 9-319067 and 2003-107664, or SPIE Vol. 2322 (1994) 374 (Large Area Optical Proximity Correction using Pattern Based Correction, D. M. Newmark et al.). By using these techniques, an integrated circuit pattern written by a designer can be formed almost according to the design pattern.

However, when these correction techniques are used, a new technique to verify these corrections is required. As a method of verifying a correction, a method of performing verification on the basis of a specification value of an actually formed mask pattern is conceived as an example. However, in order to accurately verify the correction, verification using a lithography simulator is necessary. For example, in a technique disclosed in U.S. Pat. No. 6,470,489 B1, there is proposed a verification tool which compares an edge portion of a desired pattern on a wafer and an edge portion of a pattern transferred by using a layout of a pattern to which optical proximity correction has been applied with each other by simulation to check whether a difference between the edge portions falls within a range of a predetermined allowable value. In the technique disclosed in Jpn. Pat. Appln. KOKAI Publication No. 9-319067, there is proposed a method for performing optical proximity correction and preparing a physical model for verification to accurately predict a positional difference between an edge portion of a desired pattern and an edge portion of a transferred pattern by simulation.

The "predetermined allowable value" used in these verification methods means an allowable value which is uniformly set for an integrated circuit pattern regardless of positions or line widths of the integrated circuit pattern or which is set for each position or each line width of the integrated circuit pattern. Alternatively, the "predetermined allowable value" means an allowed size variable which is regulated in advance for each part of an integrated circuit pattern such as each element of a transistor or each end portion of a line pattern. There is also a method of performing correction on the basis of each allowable value or each allowed size variable. These methods are techniques for determining an allowable range for a pattern by simulation on the basis of design data of integrated circuit patterns described by all designers.

In regard to such techniques, in recent years, a technique using a mask, called a Levenson type phase shift mask, is now beginning to be applied to the steps of manufacturing a mass-produced semiconductor device. This technique uses two masks having different opening shapes and different phases to obtain a final pattern shape on a wafer. The technique is different from a conventional technique in that two masks are used. However, since the two masks are used, the following two problems are posed. As one of the problems, the correctness of a pattern shape on a midstream stage cannot be assured by setting an allowable range based on a pattern shape on a wafer on a final stage. As the other of the problems, the correctness of a pattern shape on a wafer on a final stage cannot be assured by an allowable range based on a pattern shape formed from only one of the masks.

In the Levenson type phase shift mask, it must be noted that a portion between openings being different from each other in phase by 180° and a portion between openings being equal to each other in phase have different resolutions. More specifically, in the Levenson type phase shift mask, the resolution of the portion between the opening having a phase of 0° and the opening having a phase of 180° is higher than the resolution of the portion between openings each having a phase of 0° or the resolution of a portion between openings each having a phase of 180°. For this reason, even though patterns formed on a wafer have equal sizes, portions of the resist shapes are different from each other. As a result, portions of a process shape of a final pattern formed on a wafer are different from each other disadvantageously.

Therefore, when a Levenson type phase shift mask is used, in consideration of not only a pattern forming portion but also a phase difference between openings formed in the mask, an allowable range for the pattern needs to be independently set. However, such technique did not previously exist. More specifically, in a pattern forming step using the conventional Levenson type phase shift mask, an allowable range for a pattern to be formed is so wide that a defective portion is easily missed. Or, conversely, in the pattern forming step using the conventional Levenson type phase shift mask, an allowable range to a pattern to be formed is so strict that the processing time becomes too long, thus the throughput decreases.

BRIEF SUMMARY OF THE INVENTION

According to an aspect of the invention, there is provided a pattern data verification method for a semiconductor device comprising: extracting, from design data, design data corresponding to an edge portion of a mask pattern to obtain an edge portion of a pattern on a substrate to be processed, when the pattern is obtained on the substrate to be processed by using at least two masks each having the mask pattern corresponding to the design data; setting allowable errors with respect to the extracted design data and the design data which is not extracted, respectively; calculating a pattern formed on the substrate to be processed by using at least one mask by process simulation; and comparing an error between the pattern calculated by the simulation and the design data with the allowable error set for the design data.

According to another aspect of the invention, there is provided a computer-readable recording medium having a pattern data verification program for a semiconductor device recorded, the pattern data verification program for the semiconductor device causing a computer to execute: a process of extracting design data corresponding to an edge portion of any one of a portion which must be left on a substrate to be processed and a portion which need not be left on the substrate to be processed in a pattern formed on the substrate to be processed by using at least two masks from design data corresponding to mask patterns respectively formed on the masks; a process of setting allowable errors with respect to the extracted design data and the design data which is not extracted, respectively; a process of executing process simulation to form the pattern on the substrate to be processed on the basis of the design data of the mask pattern formed on at least one of the masks; and a process of comparing a result of the simulation with said each allowable error.

According to a further aspect of the invention, there is provided a method of manufacturing a semiconductor device comprising: extracting, from design data, design data corresponding to an edge portion of a mask pattern to obtain an edge portion of a pattern on a substrate to be processed, when the pattern is obtained on the substrate to be processed by using at least two masks each having the mask pattern corresponding to the design data; setting allowable errors with respect to the extracted design data and the design data which is not extracted, respectively; calculating a pattern formed on the substrate to be processed by using at least one mask by process simulation; comparing an error between the pattern calculated by the simulation and the design data with the allowable error set for the design data; when at least a part of the pattern calculated by the simulation is out of a range of said each allowable error, extracting the design data corresponding to the pattern being out of the range of said each allowable error; performing correction on the extracted design data corresponding to the pattern being out of the range of said each allowable error to set the design data within the range of said each allowable error; forming said each mask pattern on said each mask on the basis of the design data corresponding to the pattern falling within the range of said each allowable error as a result of the simulation and the design data corresponding to the pattern falling within the range of said each allowable error by the correction; and exposing and transferring said each mask pattern onto the substrate to be processed by using said each mask.

DETAILED DESCRIPTION OF THE INVENTION

Embodiments according to the present invention will be described below with reference to the accompanying drawings.

First Embodiment

Figure 6:
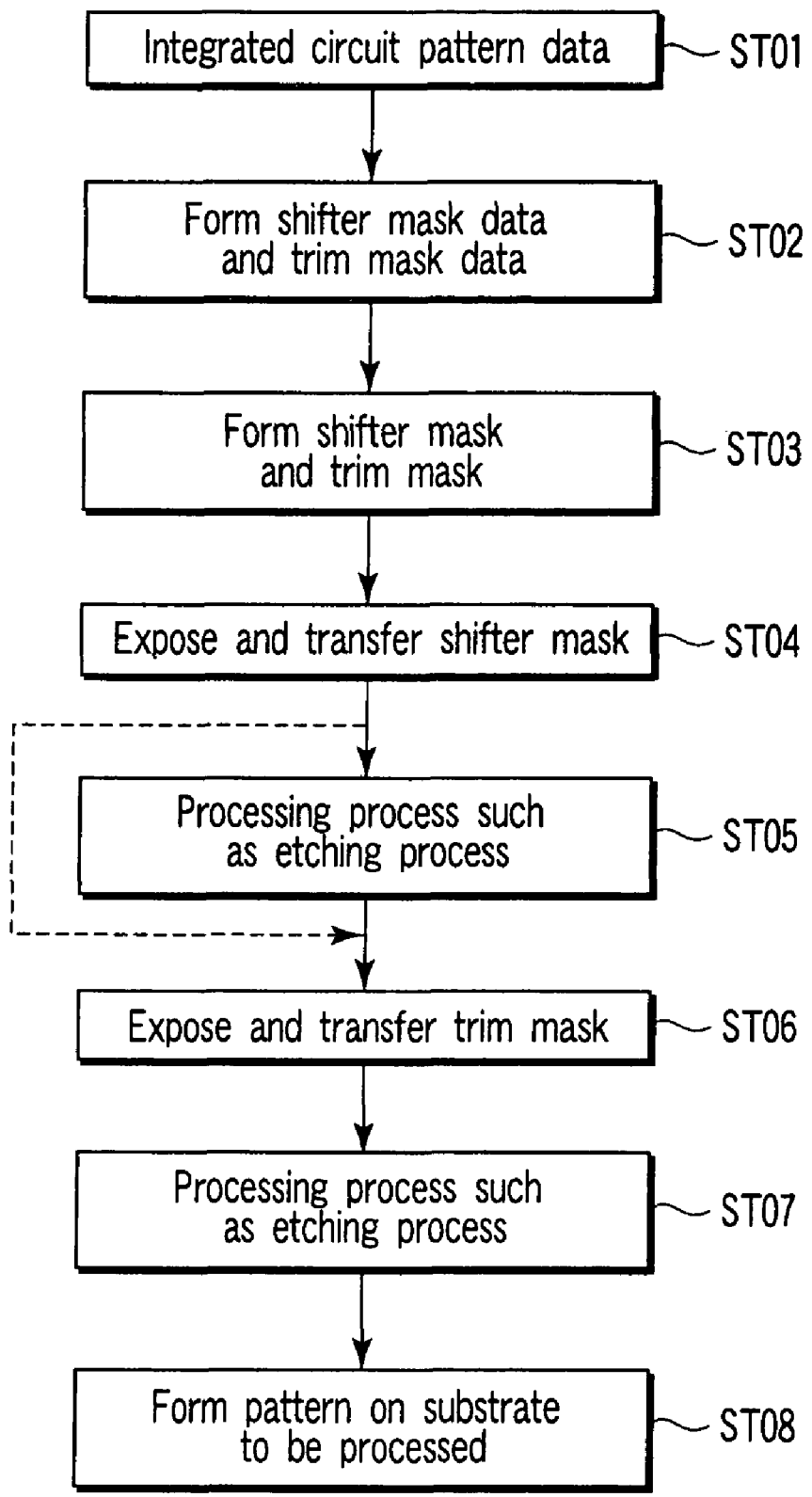
FIG. 6 is a flow chart of an outline of the pattern forming step according to the first embodiment.
Figure 7:
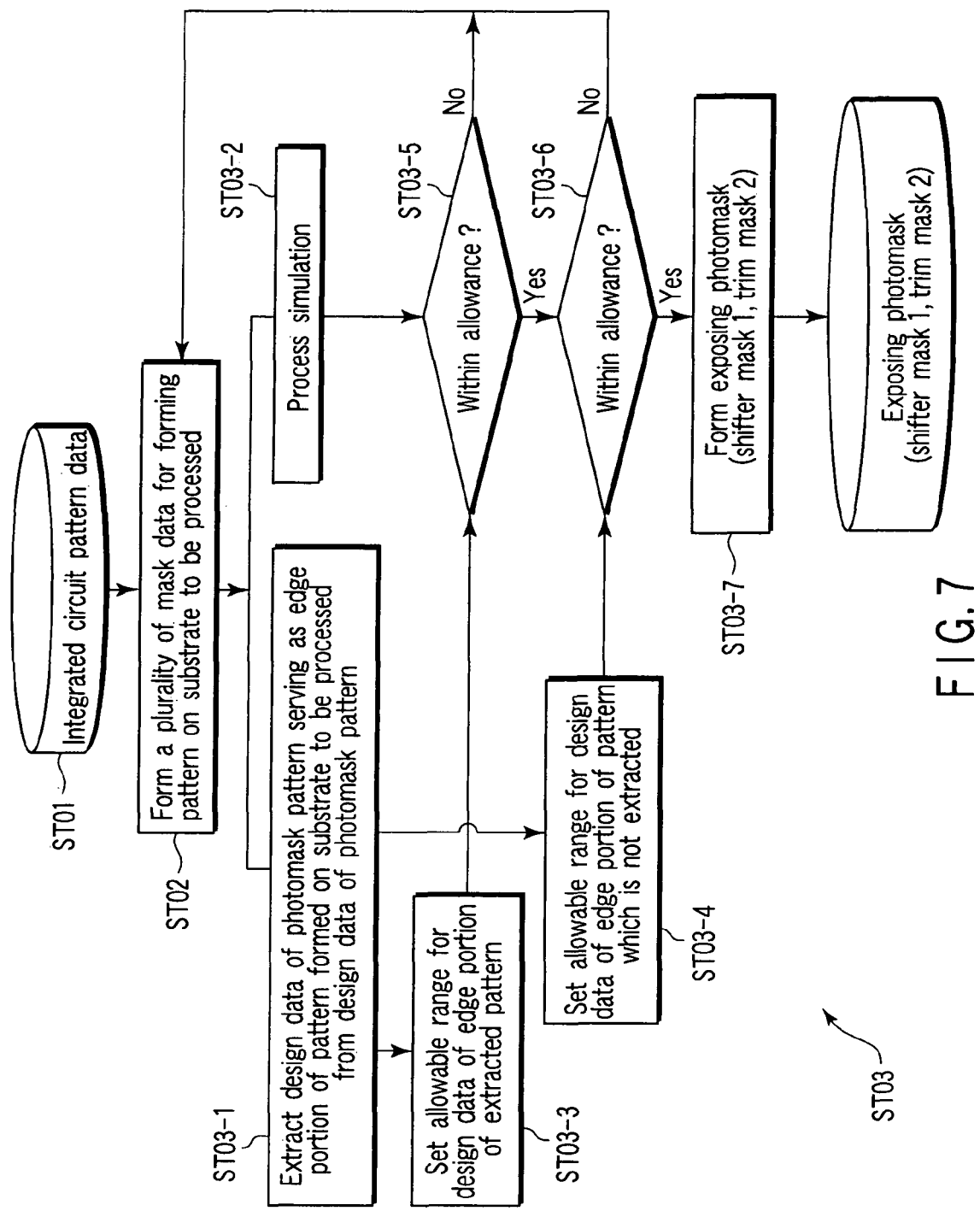
FIG. 7 is a flow chart showing more detailed steps of a pattern data verification method for a semiconductor device in a mask forming step indicated by ST03 in FIG. 6.

A first embodiment according to the present invention will be described below with reference to FIGS. 1 to 7. FIGS. 1 to 5 are schematic diagrams showing an outline of a pattern forming step according to the embodiment. FIG. 6 is a flow chart showing an outline of the pattern forming step according to the embodiment. FIG. 7 is a flow chart showing more detailed steps of a pattern data verification method for a semiconductor device in a mask forming step indicated by ST03 in FIG. 6.

The embodiment relates to a method of verifying accuracy or the like of pattern data formed when a semiconductor integrated circuit is manufactured. More specifically, in the embodiment, when a pattern of the semiconductor integrated circuit is formed on a substrate to be processed, at least two types of photomasks are used. Appropriate allowable errors or allowable ranges are allocated in advance to portions which are finally left on the substrate to be processed and portions which are not left on the substrate to be processed on a pattern formed on the substrate to be processed, respectively. At the same time, simulation of a process for forming a pattern on the substrate to be processed is executed on the basis of design data of a mask pattern formed on a photomask. The simulation result is compared with each allowable error allocated in advance to determine whether the accuracy of a pattern to be formed falls within an allowable error range. In the embodiment, a method of verifying design data of the mask pattern will be described below in detail. Consequently, a method of verifying design data of a pattern data of a semiconductor device using the above method will be described below in detail.

Figure 1:
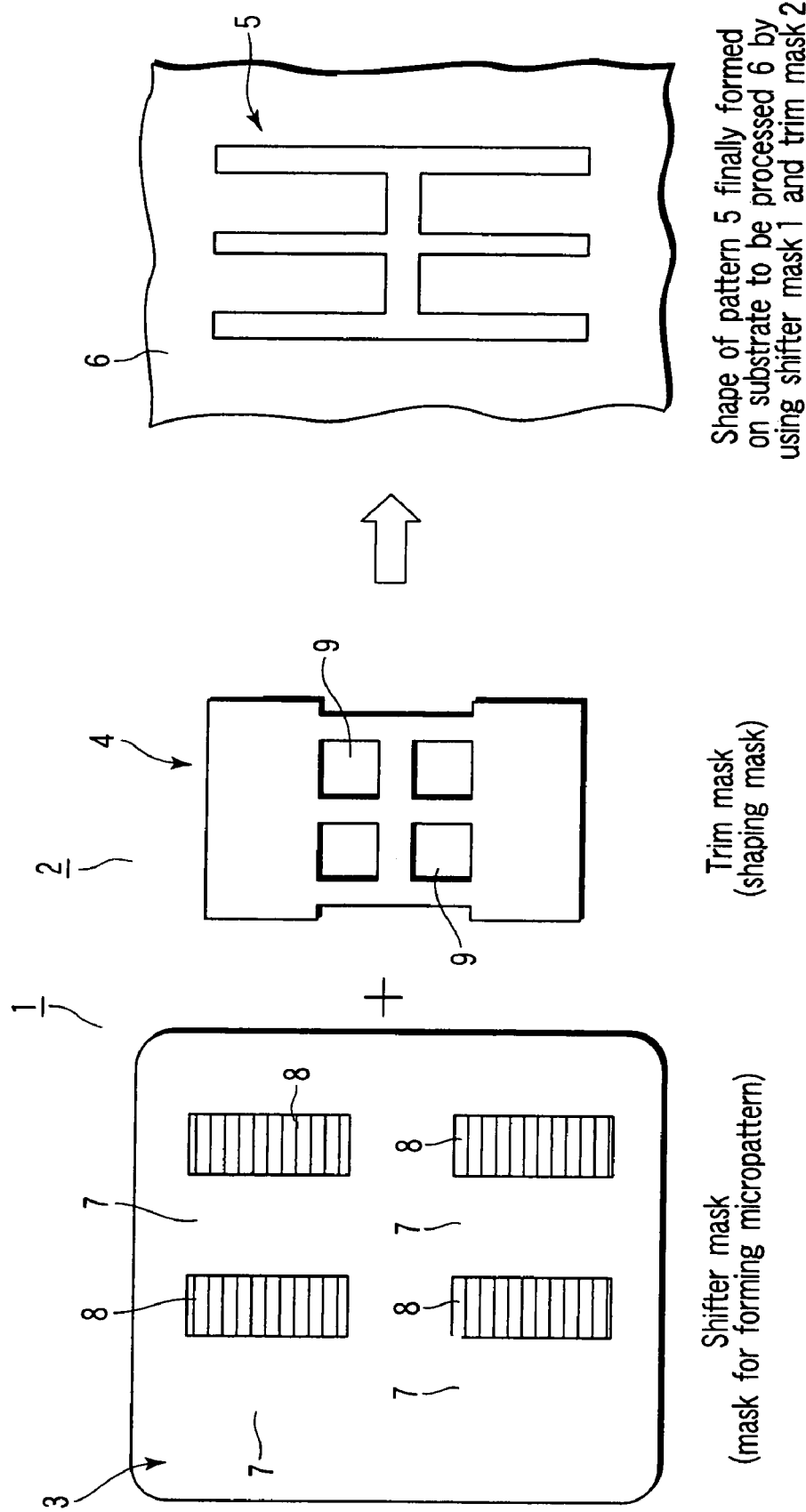
FIG. 1 is a schematic diagram showing an outline of a pattern forming step according to a first embodiment.

As shown in FIG. 1, in the pattern forming step for a semiconductor device according to the embodiment, first and second photomasks 1 and 2 of two types on which different mask patterns 3 and 4 are formed, respectively, are combined to be used. In this manner, a pattern 5 having the shape as shown in FIG. 1 is formed on a surface of a semiconductor substrate 6 serving as a substrate to be processed. The pattern 5 serves as a base for various semiconductor integrated circuits, semiconductor elements, or interconnections formed inside a semiconductor device (not shown).

The first photomask 1 is a mask of a format called a Levenson type or Alt-PSM (alternating phase shift mask). In the Levenson type photomask 1, as shown in FIG. 1, a plurality of sets of first and second openings 7 and 8 of two types having different phases are formed. Each first opening 7 is set such that a phase of exposure light (not shown) having passed through the opening 7 has a phase of about 0°. Each second opening 8 is set such that exposure light having passed through the opening 8 has a phase of about 180°. The first openings 7 and the second openings 8 are alternately arranged. In this manner, since the exposure light beams having passed through the first and second openings 7 and 8 are set to have phases of about 180° and about 0°, the Levenson type photomask 1 is also called a shifter mask. The shifter mask 1 is normally used to form a micropattern.

The second photomask 2 is a shaping mask which shapes the shape of a first exposure pattern 10 (which will be described later) formed by the shifter mask 1 into a desired shape. More specifically, the second photomask 2 is a mask to remove an unnecessary portion from the first exposure pattern 10 formed by the shifter mask 1 to finish a pattern (portion) 5 caused to be finally left on the wafer 6 serving as a semiconductor substrate. For this reason, the second photomask 2 is formed to have a shape to cover a portion serving as the pattern 5 caused to be finally left on the semiconductor substrate 6 in the first exposure pattern 10 formed by the shifter mask 1. At the same time, in the second photomask 2, a plurality of shaping openings 9, each having a shape to expose only an unnecessary portion (part) which is not caused to be finally left on the semiconductor substrate 6 in the first exposure pattern 10 formed by the shifter mask 1, are formed at positions to expose only the unnecessary portion. The second photomask 2 is normally called a trim mask. A pattern 5 caused to be finally left on the semiconductor substrate 6 in the first exposure pattern 10 is called a second exposure pattern.

Figure 2B:
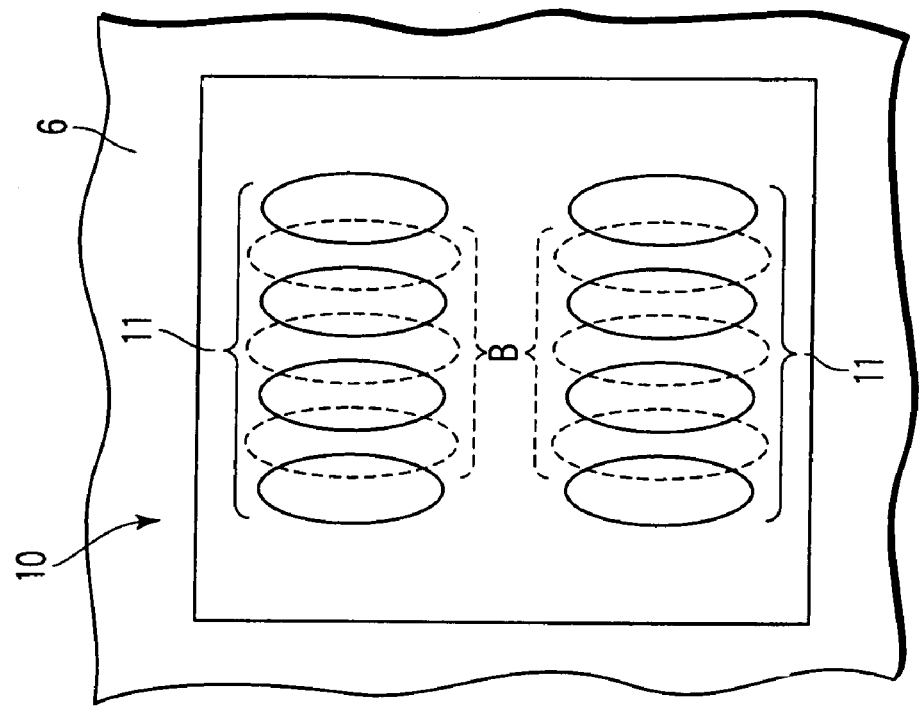
FIGS. 2A and 2B are schematic diagrams showing an outline of the pattern forming step according to the first embodiment.
Figure 2A:
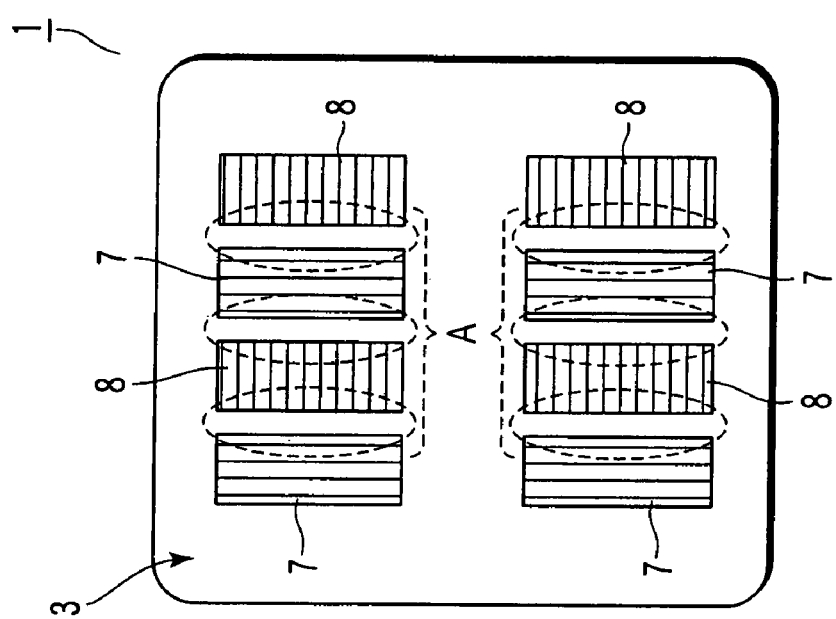

FIG. 2A is a plan view of the shifter mask 1. FIG. 2B is a plan view of the first exposure pattern 10 formed on the semiconductor substrate 6 by using the shifter mask 1 shown in FIG. 2A. When pattern transfer is performed by using the shifter mask 1 shown in FIG. 2A, the first exposure pattern 10 having a shape corresponding to the mask pattern 3 of the shifter mask 1 as shown in FIG. 2B is formed on the semiconductor substrate 6. On the first exposure pattern 10, portions facing the first and second openings 7 and 8 of the shifter mask 1 are formed as a substantially ellipse or oval shape as shown in FIG. 2B. In the mask pattern 3 formed on the shifter mask 1, a portion A surrounded by a broken line in FIG. 2A has the highest resolution. More specifically, in the mask pattern 3 formed on the shifter mask 1, a portion between each first opening 7 set such that a phase of passing light is about 0° and each second opening 8 set such that a phase of passing light is about 180° has the highest resolution. Therefore, the resolution of the first exposure pattern 10 formed on the semiconductor substrate 6 is highest at a portion B surrounded by a broken line in FIG. 2B. More specifically, in the first exposure pattern 10, a portion between opening patterns 11 adjacent to each other has the highest resolution.

Figure 3:
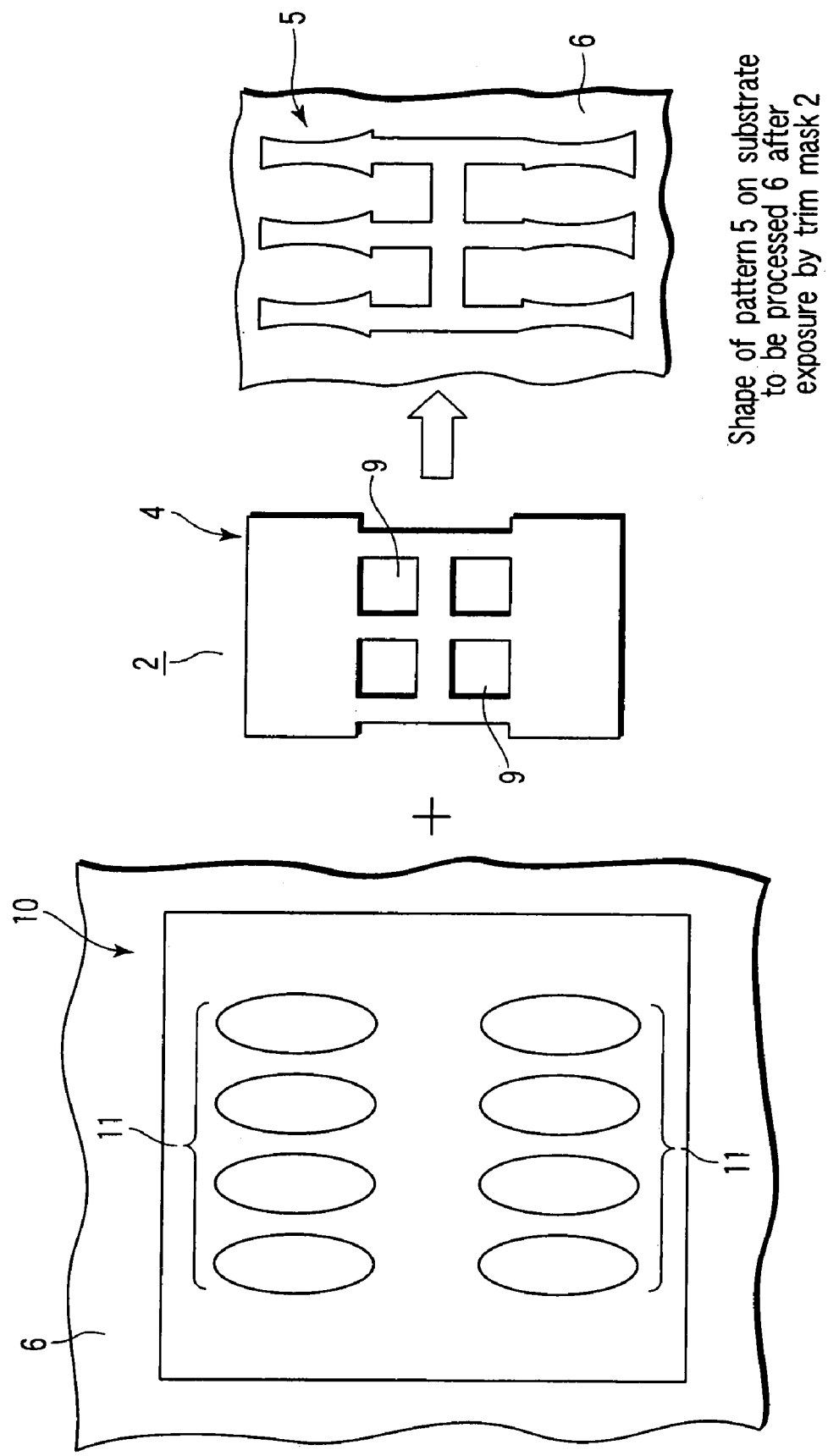
FIG. 3 is a schematic diagram showing an outline of the pattern forming step according to the first embodiment.

As shown in FIG. 3, pattern transfer is performed by the trim mask 2 for the first exposure pattern 10 formed on the semiconductor substrate 6 by the shifter mask 1. At this time, the second exposure pattern 5 having a pattern shape shown on the rightmost view in FIG. 3 is formed on the semiconductor substrate 6. More specifically, when superposition exposure is performed by using the shifter mask 1 and the trim mask 2, the second exposure pattern 5 caused to be finally left on the semiconductor substrate 6 is formed. In this case, as the second exposure pattern 5, a region covered with both the photomasks 1 and 2, i.e., the shifter mask 1 and the trim mask 2 is finally left on the semiconductor substrate 6.

Figure 4A:
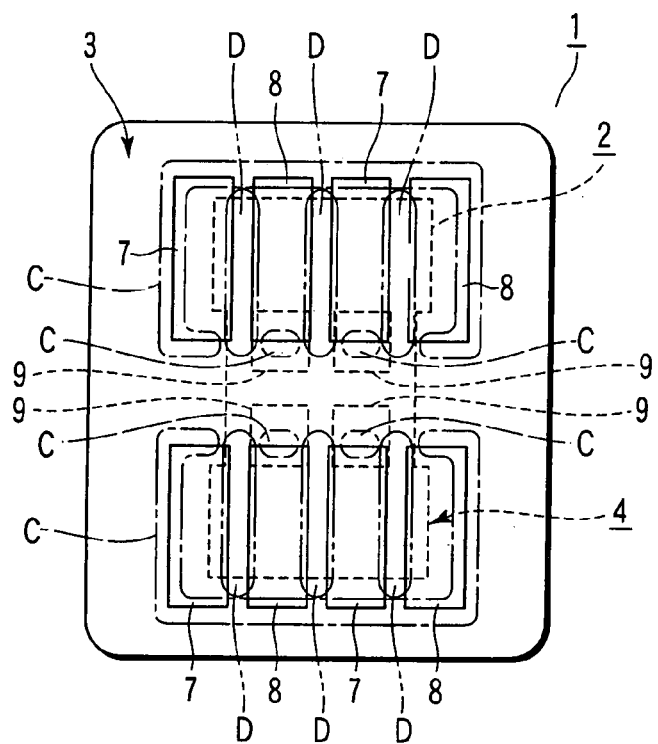
FIGS. 4A and 4B are schematic diagrams showing an outline of the pattern forming step according to the first embodiment.
Figure 4B:
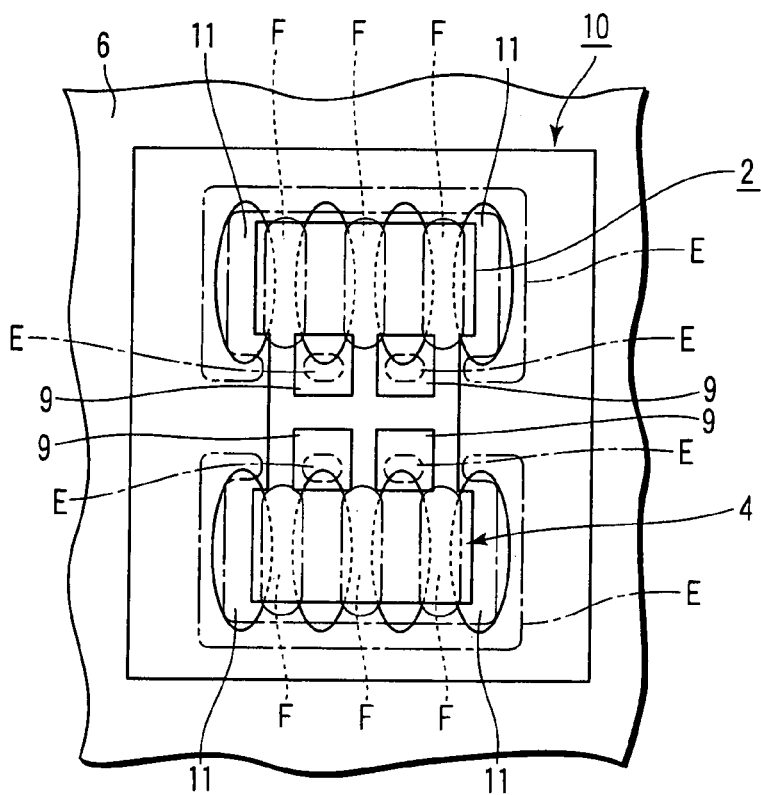

FIG. 4A is a plan view obtained when the shifter mask 1 and the trim mask 2 are superposed. FIG. 4B is a plan view obtained when the trim mask 2 is superposed on the first exposure pattern 10 formed on the semiconductor substrate 6 by using the shifter mask 1. FIG. 4B corresponds to the step of performing an exposure process by the trim mask 2 after the exposure process by the shifter mask 1, as shown in FIG. 3. More specifically, FIG. 4B shows a case in which a result of simulation of the exposure process by the shifter mask 1 and the trim mask 2 are superposed. In FIG. 4A, for illustrative convenience, unlike in FIGS. 1 and 2A, both the first and second openings 7 and 8 are shown as outline frames.

A portion C surrounded by an alternate long and short dash line in FIG. 4A indicates a portion which is not covered with the trim mask 2 on the edge portions of the first and second openings 7 and 8 included in the mask pattern 3 of the shifter mask 1. As described above, in the embodiment, the region covered with both the photomasks 1 and 2, i.e., the shifter mask 1 and the trim mask 2 is finally left on the semiconductor substrate 6 as the second exposure pattern 5. Therefore, the portion C surrounded by the alternate long and short dash line in FIG. 4A corresponds to a portion which is not required to be finally left on the semiconductor substrate 6 in the mask pattern 3 transferred onto the semiconductor substrate 6. The portion is a portion in which differences between the size and shape of the second exposure pattern 5 in the design phase and the size and shape of the second exposure pattern 5 actually formed on the semiconductor substrate 6 may be large. Namely, the portion C surrounded by the alternate long and short dash line in FIG. 4A is a portion in which allowable errors and allowable ranges of the size and shape of the second exposure pattern 5 actually formed on the semiconductor substrate 6 may be set to be large with respect to ideal size and shape of the second exposure pattern 5. However, it is important for an edge portion of the mask pattern 3 of the shifter mask 1 to be located in a region which is not covered with the trim mask 2.

Similarly, a portion E surrounded by an alternate long and short dash line in FIG. 4B indicates a portion which is not covered with the trim mask 2 in the edge portion of each opening pattern 11 of the first exposure pattern 10 formed on the semiconductor substrate 6 by the shifter mask 1. More specifically, the portion E surrounded by the alternate long and short dash line in FIG. 4B indicates a portion which is not finally left on the semiconductor substrate 6 in the first exposure pattern 10 transferred onto the semiconductor substrate 6. Therefore, the portion E surrounded by the alternate long and short dash line in FIG. 4B is a portion in which allowable ranges of the size and shape of the first exposure pattern 10 actually formed on the semiconductor substrate 6 may be set to be large with respect to the ideal size and shape of the first exposure pattern 10. However, it is important for an edge portion of the first exposure pattern 10 to be located in the region which is not covered with the trim mask 2.

In contrast to this, a portion D surrounded by a chain double-dashed line in FIG. 4A indicates a portion covered with the trim mask 2 in the edge portions of the first and second openings 7 and 8 included in the mask pattern 3 of the shifter mask 1. Therefore, the portion D surrounded by the chain double-dashed line in FIG. 4A is a portion which must be finally left on the semiconductor substrate 6 in the mask pattern 3 transferred onto the semiconductor substrate 6. The portion is a portion in which the size and shape of the second exposure pattern 5 actually formed on the semiconductor substrate 6 should not be considerably different from the size and shape of the second exposure pattern 5 in the design phase. More specifically, the portion D surrounded by the chain double-dashed line in FIG. 4A is a portion in which allowable ranges of the size and shape of the second exposure pattern 5 actually formed on the semiconductor substrate 6 should be strictly set with respect to the ideal size and shape of the second exposure pattern 5.

Similarly, a portion F surrounded by a chain double-dashed line in FIG. 4B indicates a portion covered with the trim mask 2 of the edge portion of each opening pattern 11 included in the first exposure pattern 10. More specifically, the portion F surrounded by the chain double-dashed line in FIG. 4B is a portion finally left on the semiconductor substrate 6 in the first exposure pattern 10 transferred onto the semiconductor substrate 6. Therefore, the portion F surrounded by the chain double-dashed line in FIG. 4B is a portion in which allowable ranges of the size and shape of the first exposure pattern 10 actually formed on the semiconductor substrate 6 should be strictly set with respect to the ideal size and shape of the first exposure pattern 10.

More specifically, the portion D surrounded by the chain double-dashed line in FIG. 4A and the portion F surrounded by the chain double-dashed line in FIG. 4B constitute some of various semiconductor elements or semiconductor integrated circuits (not shown), various interconnections, or the like provided on the semiconductor substrate 6. For this reason, the portion D surrounded by the chain double-dashed line in FIG. 4A and the portion F surrounded by the chain double-dashed line in FIG. 4B are portions which require high forming accuracy for pattern sizes and shapes. Therefore, in design of the mask pattern 3 of the shifter mask 1, with respect to pattern data of the portions corresponding to the portion D surrounded by the chain double-dashed line in FIG. 4A and the portion F surrounded by the chain double-dashed line in FIG. 4B, strict allowable ranges must be set depending on performance of the various semiconductor devices, the line widths of the interconnections, and the like. For example, in the mask pattern 3, with respect to the pattern data of the portions corresponding to the portion D surrounded by the chain double-dashed line in FIG. 4A and the portion F surrounded by the chain double-dashed line in FIG. 4B, allowable ranges are preferably set as follows.

As one of the allowable ranges, an allowable range for the edge portion of the second exposure pattern 5 caused to be left on the semiconductor substrate 6 is set within about 10% of the size of the mask pattern 3 regulated by a design rule.

As another one of the allowable ranges, an allowable range to a size of the edge portion of the second exposure pattern 5 caused to be left on the semiconductor substrate 6 is set within about 10% of the size of the mask pattern 3 regulated by the design rule. For example, it is assumed that the minimum size of the mask pattern 3 regulated by the design rule is set at about 40 nm. In this case, an allowable range of the size of the second exposure pattern 5 actually formed on the semiconductor substrate 6 is given by about 40 nm±about 40 nm×about 0.1=about 40 nm±about 4 nm.

As another allowable range, an allowable range of the size of the edge portion of the second exposure pattern 5 caused to be left on the semiconductor substrate 6 is set depending on the types of the included circuits, interconnections, and the like and the degrees of miniaturization. For example, it is assumed that, in the second exposure pattern 5 caused to be left on the semiconductor substrate 6, a size in a design rule of a portion functioning as a gate of a transistor (not shown) formed on the semiconductor substrate 6 is about 40 nm, and the allowable range is set at about 5%. In this case, in the second exposure pattern 5 actually formed on the semiconductor substrate 6, an allowable range of the size of the edge portion of the portion corresponding to the gate of the transistor is given by about 40 nm±about 40 nm×about 0.05=about 40 nm±about 2 nm. Alternatively, it is assumed that, in the second exposure pattern 5 caused to be left on the semiconductor substrate 6, a size in design rule of a portion functioning as an interconnection (not shown) formed on the semiconductor substrate 6 is about 40 nm, and the allowable range of the size is set at about 20%. In this case, in the second exposure pattern 5 actually formed on the semiconductor substrate 6, an allowable range of a size of a portion corresponding to the edge portion of the interconnection is given by about 40 nm±about 40 nm×about 0.2=about 40 nm±about 8 nm.

Furthermore, as another range, an allowable range of the size of the edge portion of the second exposure pattern 5 caused to be left on the semiconductor substrate 6 is set in consideration of a fluctuation in size of the second exposure pattern 5 and a superposing margin between the shifter mask 1 and the trim mask 2 with respect to a portion which requires coverage for a contact hole.

In contrast to this, the portion C surrounded by the alternate long and short dash line in FIG. 4A and the portion E surrounded by the alternate long and short dash line in FIG. 4B, as described above, are portions which are not finally left on the semiconductor substrate 6. Therefore, when the mask pattern 3 of the shifter mask 1 is designed, in the mask pattern 3, strict allowable ranges need not be set for the pattern data of the portions corresponding to the portion C surrounded by the alternate long and short dash line in FIG. 4A and the portion E surrounded by the alternate long and short dash line in FIG. 4B. However, it is important for the edge portion of the mask pattern 3 to be located in a region which is not covered with the trim mask 2. More specifically, it is important for the edge portion of the mask pattern 3 of the shifter mask 1 to be located in a region which does not constitute some of various semiconductor elements or semiconductor integrated circuits (not shown), various interconnections, or the like provided on the semiconductor substrate 6. With respect to the pattern data of the portions corresponding to the portion C surrounded by the alternate long and short dash line in FIG. 4A and the portion E surrounded by the alternate long and short dash line in FIG. 4B in the mask pattern 3, for example, allowable ranges may be set as shown in FIGS. 5A and 5B.

Figure 5A:
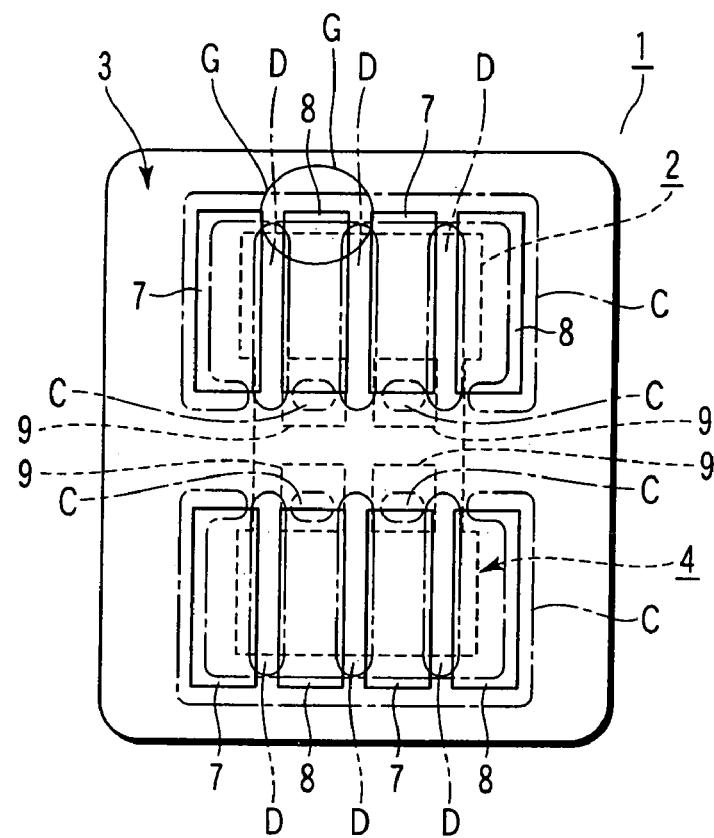
FIGS. 5A and 5B are schematic diagrams showing an outline of the pattern forming step according to the first embodiment.
Figure 5B:
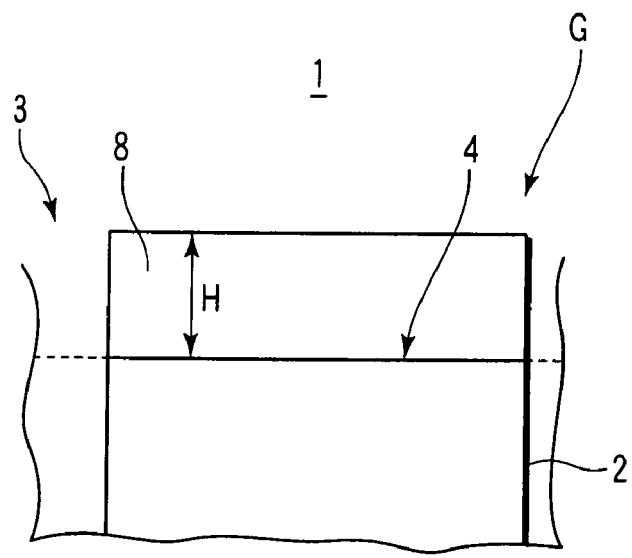

FIG. 5A, as in FIG. 4A, shows a plan view obtained when the shifter mask 1 and the trim mask 2 are superposed. FIG. 5B is an enlarged view of a portion G surrounded by a solid-line circle in FIG. 5A. In the mask pattern 3, an interval indicated by H in FIG. 5B may be set as an allowable range for pattern data of a portion corresponding to a portion which is not finally left on the semiconductor substrate 6. More specifically, an interval between the edge portion of the second opening 8 or the first opening 7 included in the mask pattern 3 formed on the shifter mask 1 and the edge portion of the trim mask 2 may be set as an allowable range. Regardless of whether the pattern is finally left on the semiconductor substrate 6, when the allowable ranges of the size and shape of the first exposure pattern 10 actually formed on the semiconductor substrate 6 are set with respect to the size and shape of an ideal pattern in a design phase, a fluctuation of actual processes and the superposing margin between the shifter mask 1 and the trim mask 2 must be considered. In FIG. 5A, for illustrative convenience, as in FIG. 4A described above, both of the first and second openings 7 and 8 are shown as outline frames.

A pattern forming step according to the embodiment will be described below with reference to FIGS. 6 and 7. The flow chart shown in FIG. 6 expresses an outline of steps performed until a pattern transfer image is obtained on the semiconductor substrate 6 by using the Levenson type phase shift mask 1.

Pattern data of a desired semiconductor integrated circuit (not shown) to be formed on the semiconductor substrate 6 is generated or designed. This is defined as step 01 (ST01).

On the basis of the pattern data generated in step 01, data of the mask pattern 3 of the shifter mask 1 and data of the mask pattern 4 of the trim mask 2 are generated. More specifically, mask data of the two photomasks 1 and 2 each having a pattern shape as shown in FIG. 1 are generated. This is defined as step 02 (ST02).

On the basis of the data of the mask patterns 3 and 4 generated in step 02, the shifter mask 1 and the trim mask 2 are formed. This is defined as step 03 (ST03).

By using the shifter mask 1 formed in step 03, the mask pattern 3 is exposed and transferred to a resist film or the like (not shown) on the semiconductor substrate 6. In this manner, the first exposure pattern 10 is transferred onto the semiconductor substrate 6. This is defined as step 04 (ST04).

In step 04, a processing process such as a developing process is performed to the resist film or the like onto which the first exposure pattern 10 has been transferred in step 04. In this manner, the first exposure pattern 10 shown in FIGS. 2B or 3 is formed on the semiconductor substrate 6. This is defined as step 05 (ST05).

In step 05, the mask pattern 4 is exposed and transferred onto the resist film or the like onto which the first exposure pattern 10 has been formed in step 05 by using the trim mask 2 formed in step 03. In this manner, the mask pattern 4 is superposed and transferred onto the first exposure pattern 10 formed on the semiconductor substrate 6. This is defined as step 06 (ST06).

A processing process such as a developing process is performed on the resist film or the like onto which the mask pattern 4 has been transferred in step 06. This is defined as step 07 (ST07).

Various steps such as a developing process are performed to the semiconductor substrate 6 to which the processing process has been performed in step 07 to form the second exposure pattern 5 on the semiconductor substrate 6. More specifically, the pattern 5 of a desired semiconductor integrated circuit to be finally left on the semiconductor substrate 6 is formed on the semiconductor substrate 6. This is defined as step 08 (ST08).

As indicated by a broken-line arrow in FIG. 6, the operation may skip step 05 and shift from step 04 to step 06. More specifically, an exposure transfer step of the mask pattern 3 using the shifter mask 1 in step 04 and an exposure transfer step of the mask pattern 4 using the trim mask 2 may be continuously performed. In this case, after the exposure transfer step of the mask pattern 4 using the trim mask 2 is ended, processing processes such as a developing process and an etching process may be performed to the resist film or the like on the semiconductor substrate 6 in step 07. In this manner, the second exposure pattern 5 having a pattern shape obtained by superposing the mask pattern 3 of the shifter mask 1 and the mask pattern 4 of the trim mask 2 can be more easily and rapidly formed on the semiconductor substrate 6.

In this manner, the steps from steps 01 to 08 shown in FIG. 6 are performed to cause only a portion covered with both the photomasks of the shifter mask 1 and the trim mask 2 to be left on the semiconductor substrate 6 as the second exposure pattern 5 as shown in FIGS. 1 and 3. More specifically, the second exposure pattern 5 of the desired semiconductor integrated circuit is formed on the semiconductor substrate 6.

A step of forming the shifter mask 1 and the trim mask 2 shown in ST03 in FIG. 6 will be described below in detail with reference to FIG. 7. More specifically, a step of verifying design data of a mask pattern in the pattern forming step according to the embodiment will be described below in detail with reference to FIG. 7. In FIG. 7, in order to easily explain the verification method for design data of the mask pattern according to the embodiment, steps ST01 and ST02 which are steps performed before ST03 are consciously shown.

As described above, pattern data of a desired semiconductor integrated circuit (not shown) to be formed on the semiconductor substrate 6 is generated or designed in step 01.

In step 02, a plurality of mask data to form the second exposure pattern 5 on the semiconductor substrate 6 are generated on the basis of the pattern data generated in step 01. More specifically, the design data of the mask pattern 3 of the shifter mask 1 and the design data of the mask pattern 4 of the trim mask 2 shown in FIG. 1 are generated on the basis of the pattern data generated in step 01.

The design data of the photomask patterns 3 and 4 serving as the edge portion of the pattern formed on the semiconductor substrate 6 are extracted from the design data of the photomask patterns 3 and 4. More specifically, of the design data of the mask pattern 3 of the shifter mask 1 and the design data of the mask pattern 4 of the trim mask 2, design data of an edge portion of any one of the pattern 5 of the semiconductor integrated circuit which is finally left on the semiconductor substrate 6 and a pattern which is not left on the semiconductor substrate 6 is extracted from the design data of each of the mask patterns 3 and 4. In this case, the design data of the edge portion of the pattern 5 of the semiconductor integrated circuit finally left on the semiconductor substrate 6 is extracted from the design data of the photomask patterns 3 and 4. This is defined as step 03-1 (ST03-1).

Accordingly, in parallel to the step 03-1, on the basis of the design data of the mask patterns 3 and 4 formed on at least one of the shifter mask 1 and the trim mask 2, simulation of a process of forming the pattern 5 of the semiconductor integrated circuit on the semiconductor substrate 6 is executed. This is defined as step 03-2 (ST03-2).

As a method of executing the simulation in step 03-2, a method of using results independently calculated for the masks of the shifter mask 1 and the trim mask 2 is known. The following method may also be used. That is, as described above, a double exposure process is performed without performing step 05 of the steps from step 01 to step 08 shown in FIG. 6, and a result obtained by calculating superposition of the images of the patterns 3 and 4 of both the shifter mask 1 and the trim mask 2 is used. Furthermore, in execution of simulation in step 03-2, it is desirable to perform simulation which takes, as parameters, fluctuations in process such as a dose of exposure light, a light intensity (threshold level), focus, aberration, diffusion of an acid in a resist film, and the like which can occur in an actual lithography step.

An allowable range is set for design data of the edge portion of the pattern extracted in step 03-1. More specifically, an allowable range is set for the design data of the edge portion of the pattern 5 of the semiconductor integrated circuit which is finally left on the semiconductor substrate 6, the design data being extracted from the design data of the photomask patterns 3 and 4. This is defined as step 03-3 (ST03-3). At the same time, an allowable range is set for the design data of the edge portion of the pattern which is not extracted in step 03-1. More specifically, an allowable value is set for the design data of the edge portion of the pattern which is not finally left on the semiconductor substrate 6, the design data not being extracted from the design data of the photomask patterns 3 and 4. This is defined as step 03-4 (ST03-4).

The allowable range for the design data of the edge portion of the pattern which is extracted in step 03-1 and an allowable range for the design data of the edge portion of the pattern which is not extracted in step 03-1 are respectively and independently set. In this case, the allowable range for the design data of the edge portion of the pattern 5 of the semiconductor integrated circuit which is finally left on the semiconductor substrate 6 is stricter (smaller) than the allowable range for the design data of the edge portion of the pattern which is not finally left on the semiconductor substrate 6.

A result, the simulation in step 03-2 is compared with an allowable range set in step 03-3. More specifically, it is determined whether the allowable range, set in step 03-3, for the design data of the edge portion of the pattern extracted in step 03-1 falls within an allowance. This is defined as step 03-5 (ST03-5). When the allowable range set in step 03-3 falls within the allowance obtained by the simulation in step 03-2, the operation shifts to step 03-6 (which will be described later). When the allowable range set in step 03-3 does not fall within the allowance obtained by the simulation in step 03-2, the allowable range is regarded as an error to cause the operation to return to step ST02 described above. The step is repeated until the allowable range set in step 03-3 falls within the allowance obtained by the simulation in step 03-2. The other is a feedback operation which changes various processing parameters used in formation of the design data of the photomask pattern 3 and the photomask pattern 4 to appropriate values to perform correction.

Similarly, the result of the simulation in step 03-2 is compared with an allowable range set in step 03-4. More specifically, it is determined whether the allowable range, set in step 03-4, for the design data of the edge portion of the pattern which is not extracted in step 03-1 falls within the allowance. This is defined as step 03-6 (ST03-6). When the allowable range set in step 03-4 falls within the allowance obtained by the simulation in step 03-2, the operation shifts to step 03-7 (which will be described later). When the allowable range set in step 03-4 does not fall within the allowance obtained by the simulation in step 03-2, the allowable range is regarded as an error to cause the operation to return to step ST02 described above. The step is repeated until the allowable range set in step 03-4 falls within the allowance obtained by the simulation in step 03-2.

After it is confirmed that both the allowable range set in step 03-3 and the allowable range set in step 03-4 fall within the allowance obtained by process simulation in step 03-2, the photomasks 1 and 2 for exposure are formed on the basis of the design data. More specifically, after it is finally confirmed that the design data of the photomask pattern 3 and the photomask pattern 4 have no problem, the shifter mask 1 provided with the mask pattern 3 and the trim mask 2 provided with the mask pattern 4 are formed. This is defined as step 03-7 (ST03-7).

When it is determined in step 03-5 and step 03-6 that the design data of the photomask pattern 3 and the photomask pattern 4 include errors, design data at positions where the patterns 3 and 4 include the problems must be extracted to inspect the causes of the problems. In this case, as feedback destinations of the inspection result, for example, two feedback destinations (which will be described below) are conceived. As one of the feedback destinations, of the design data of the photomask pattern 3 and the photomask pattern 4, the design data at the positions where the problems have occurred are changed into appropriate values to perform correction. As the other, various processing parameters used in formation of the design data of the photomask pattern 3 and the photomask pattern 4 are changed into appropriate values to perform correction.

In this manner, two exposure photomasks, the shifter mask 1 provided with the mask pattern 3 and the trim mask 2 provided with the mask pattern 4, are formed on the basis of the design data free from any problem in step 03. Thereafter, the operation shifts to step 04 in which, as shown in FIG. 6, by using the shifter mask 1 formed in step 03, the mask pattern 3 is exposed and transferred onto the resist film or the like on the semiconductor substrate 6. The subsequent steps are as described above.

As described above, according to the first embodiment, it is possible to easily find a defective pattern which has been overlooked because the same allowable range as that of a pattern which is not finally left on the semiconductor substrate 6 in a conventional technique is set for the pattern finally left on the semiconductor substrate 6. Consequently, the defective pattern can be almost completely eliminated. Alternatively, according to the first embodiment, it is possible to easily find a portion which has become excess specifications because the same allowable range as that of a pattern finally left on the semiconductor substrate 6 in a conventional technique is set for the pattern which is not finally left on the semiconductor substrate 6. Consequently, it is possible to almost completely eliminate a risk of generating such excess specifications. More specifically, according to the first embodiment, regardless of whether a pattern is finally left on the semiconductor substrate 6, these allowable ranges can be appropriate verified with respect to various patterns formed on the semiconductor substrate 6 by using the shifter mask 1 and the trim mask 2.

More specifically, according to the embodiment, allowable ranges each having an appropriate size can be properly and rapidly set for a pattern which is not finally left on the semiconductor substrate 6 like the portion surrounded by the alternate long and short dash line C in FIG. 4A or the portion E surrounded by the alternate long and short dash line in FIG. 4B and for the second exposure pattern 5 finally left on the semiconductor substrate 6 like the portion D surrounded by the chain double-dashed line in FIG. 4A or the portion F surrounded by the chain double-dashed line in FIG. 4B. More specifically, appropriate allowable ranges of the size and shape of the pattern actually formed on the semiconductor substrate 6 with respect to the size and shape of the ideal pattern in the design phase can be accurately set regardless of whether the pattern is finally left on the semiconductor substrate 6, without generating a risk of decreasing a throughput in the lithography step. For this reason, the pattern 5 of a desired semiconductor integrated circuit or the like can be efficiently and accurately formed on the semiconductor substrate 6.

As described above, according to the embodiment, in the lithography step using at least the two masks, i.e., the shifter mask 1 and the trim mask 2, there can be provided a verification method for pattern data of a semiconductor device which can appropriately and easily determine whether an allowable error for design data of a pattern to be formed falls within an appropriate range by using simulation.

Second Embodiment

Figure 8A:
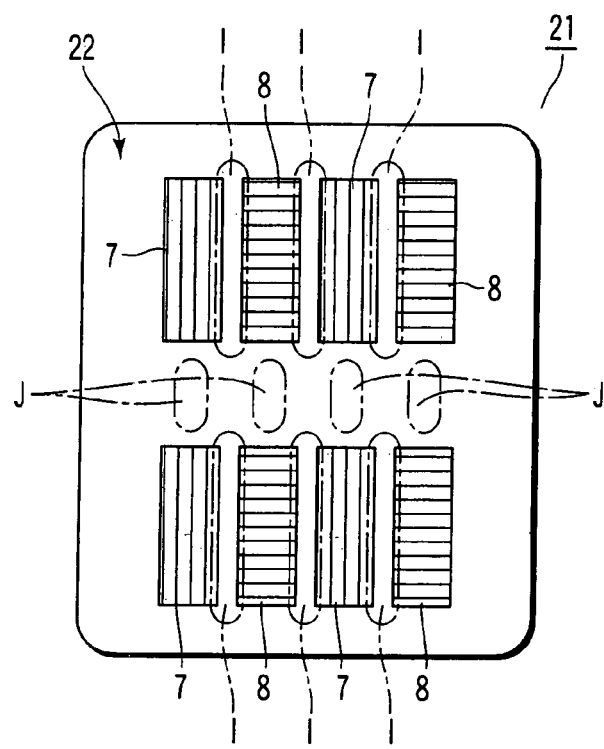
FIGS. 8A and 8B are schematic diagrams showing an outline of a pattern forming step according to a second embodiment.
Figure 8B:
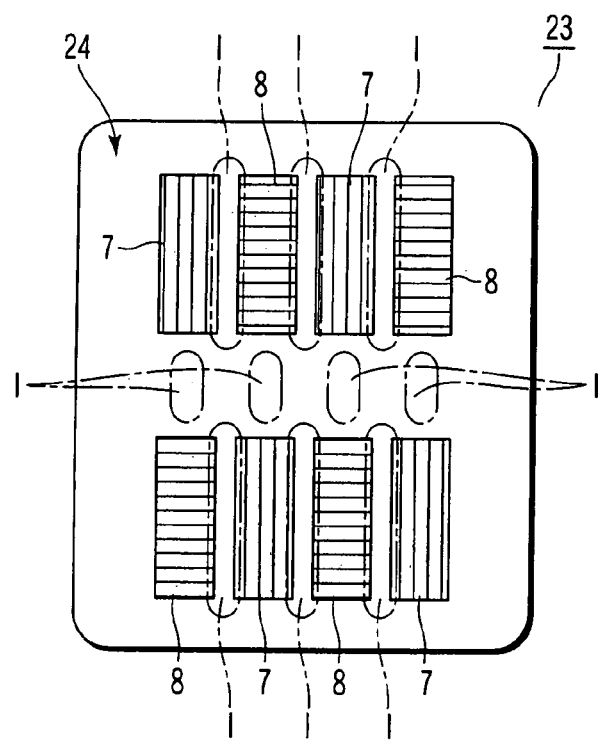

A second embodiment of the present invention will be described below with reference to FIGS. 8A and 8B. FIGS. 8A and 8B are schematic diagrams showing an outline of a pattern forming step according to the embodiment. The same reference numerals as those in the first embodiment denote the same parts in the second embodiment, and a description thereof will be omitted.

The embodiment explains a case in which a portion which is required to be further considered is added when data of a mask pattern of the shifter mask 1 is verified in the first embodiment. This will be concretely described below.

In a photomask pattern 22 held by a shifter mask 21 shown in FIG. 8A, a plurality of first openings 7 and a plurality of second openings 8, which are different from each other in phase by about 180°, are alternately arranged in two lines as described above. Arrangement orders of the first openings 7 and the second openings 8 in the two lines are equal to each other. In the photomask pattern 22 having the above pattern shape, as indicated by a portion I indicated by an alternate long and short dash line in FIG. 8A, portions between the first opening 7 and the second openings 8 being different from each other in phase exist. Accordingly, as indicated by a portion J indicated by a chain double-dashed line in FIG. 8A, portions between the first openings 7 being equal to each other in phase or portions between the second openings 8 being equal to each other in phase exist.

In contrast to this, in a photomask pattern 24 held by a shifter mask 23 shown in FIG. 8B, as in the photomask pattern 22 held by the shifter mask 21 shown in FIG. 8A, a plurality of first openings 7 and a plurality of second openings 8 are alternately arranged in two lines. However, the orders of the first openings 7 and the second openings 8 in two lines are opposite to each other. In the photomask pattern 24 having such a pattern shape, as indicated by a portion I indicated by an alternate long and short dash line in FIG. 8B, only portions between the first openings 7 and the second openings 8 being different from each other in phase exist. In the photomask pattern 24, as indicated by a portion J indicated by a chain double-dashed line in FIG. 8A, no portions between the first openings 7 being equal to each other in phase or the second openings 8 being equal to each other in phase exist.

As described in the first embodiment, in the shifter masks 21 and 23, a pattern between the first opening 7 and the second opening 8 being different from each other in phase by about 180° has the highest resolution. However, as shown in FIG. 8A, depending on arrangement positions of the first openings 7 and the second openings 8, portions between the adjacent openings 7 or 8 being equal to each other in phase, for example, about 0° and about 0° or about 180° and about 180° are generated. At these positions, depending on an observation result on the semiconductor substrate 6 or a result of simulation, even though the same size or the same shape as that at another portion is obtained, a final size or a final shape obtained after the processing may change. Therefore, in order to avoid the risk of posing the problem, when the mask data of the shifter mask 21 is verified, allowable specifications are preferably changed depending on arrangement information of the openings 7 and 8. More specifically, when the mask data of the shifter mask 21 is verified, allowable specifications are preferably set at different appropriate values depending on the arrangement information of phases in the photomask pattern 24.

For example, with respect to a size obtained by the process simulation, when a portion sandwiched by the openings 7 and 8 being different from each other in phase has a size over about 60 nm, the size is set to be reported as an out-of-range size. In contrast, when a portion sandwiched by the openings 7 and 8 having the same phase has a size over about 80 nm, the size is set to be reported as an out-of-range size. More specifically, an allowable range for a portion sandwiched between the openings 7 and 8 having equal phases is set to be more moderate than an allowable range for a portion sandwiched between the openings 7 and 8 being different from each other in phase. When the setting is thus performed, a risk of causing a defect in the pattern by applying an unnecessarily moderate allowable specification can be suppressed or reduced. Alternatively, the risk of decreasing a throughput in the lithography step by compelling an unnecessarily strict allowable specification can be suppressed or reduced.

As a threshold value of an allowable error for the portion between the openings 7 and 8, in place of concrete numerical values such as about 60 nm and about 80 nm, for example, values which are about 1.5 times or about 2 times the size regulated by a design rule may be set, as a matter of course. A threshold value of an allowable error to the portion between the openings 7 and 8 can also be set in consideration of a processing conversion difference between the exposure transfer step performed by the shifter mask 1 in step 04 and the exposure transfer step performed by the trim mask 2 in step 06 in FIG. 6 described in the first embodiment.

As described above, according to the second embodiment, the same effect as that of the first embodiment can be obtained. In this embodiment, data related to at least phase arrangement information of a plurality of data related to phases and transmittances included in the design data of the mask patterns 22 and 24 formed on the shifter masks 21 and 23 are acquired from the design data of the mask patterns 22 and 24. When simulation is executed on the basis of the acquired arrangement information related to the phases, an allowable error based on a fluctuation from the design data of the mask pattern 3 formed on the semiconductor substrate 6 is set as a parameter.

According to these steps, an appropriate allowable range of the size or shape of the pattern actually formed on the semiconductor substrate 6 with respect to the size or shape of an ideal pattern in the design phase can be accurately set without the risk of decreasing a throughput in the lithography step. In this manner, the second exposure pattern 5 of a desired semiconductor integrated circuit or the like can be efficiently and accurately formed on the semiconductor substrate 6.

Third Embodiment

Figure 9:
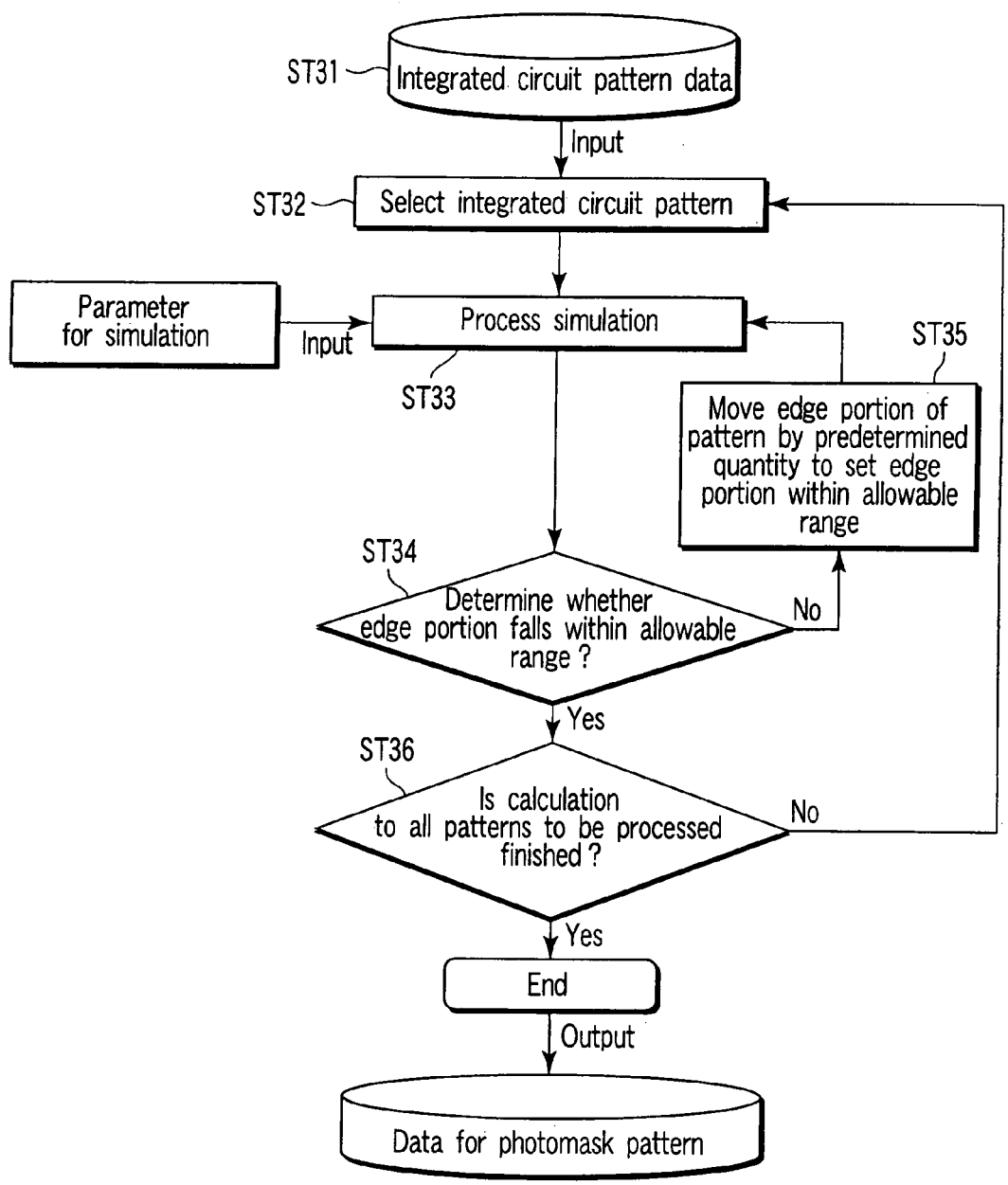
FIG. 9 is a flow chart showing an outline of a pattern data correcting method for a semiconductor device according to a third embodiment.
Figure 10:
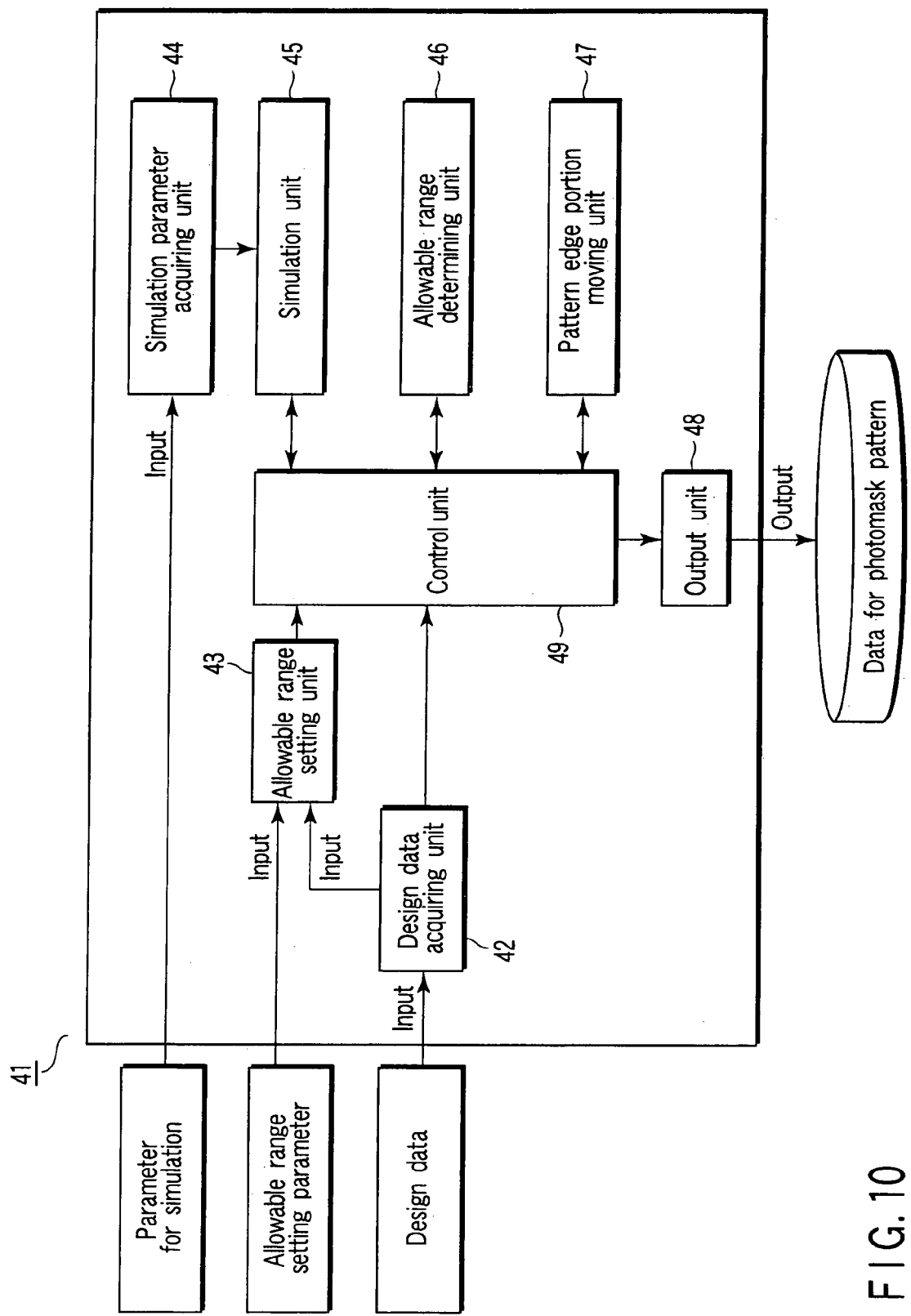
FIG. 10 is a block diagram showing an outline of a pattern data correcting apparatus for a semiconductor device according to the third embodiment.

A third embodiment of the present invention will be described below with reference to the FIGS. 9 and 10. FIG. 9 is a flow chart showing an outline of a pattern data correcting method for a semiconductor device according to the embodiment. FIG. 10 is a block diagram showing an outline of a pattern data correcting apparatus for a semiconductor device according to the third embodiment. The same reference numerals as those in the first and second embodiments denote the same parts in the third embodiment, and a detailed description thereof will be omitted.

In the embodiment, as the pattern data correcting method for a semiconductor device, a mask pattern data correcting method using the mask pattern data verification method according to the first embodiment will be described below. In addition to this, a mask pattern data correcting program serving as a pattern data correcting program for a semiconductor device to cause a computer serving as a data correcting apparatus to actually execute the mask pattern data correcting method will be described below.

The mask pattern data correcting method expressed by the flow chart in FIG. 9 is a mask pattern data correcting method based on a general model base using simulation. More specifically, the method is a correcting method called optical proximity correction (OPC). Design data of a mask pattern is formed by performing steps 32 (ST32) to 36 (ST36) at least once to form a pattern shape on the semiconductor substrate 6 as desired. However, during the steps, a design data verification method for a mask pattern described in the first embodiment is used. The method will be concretely described below in detail.

Data of the pattern 5 of a desired semiconductor integrated circuit (not shown) to be formed on the semiconductor substrate 6 is formed. This is defined as step 31 (ST31).

A predetermined range of the pattern of the semiconductor integrated circuit formed in step 31 is selected, and design data corresponding to an edge portion of a pattern corresponding to a desired portion, for example, a pattern finally formed on the semiconductor substrate 6 is selected and extracted from the range. This is defined as step 32 (ST32).

On the basis of the design data selected in step 32, simulation of a process of forming the pattern 5 of the semiconductor integrated circuit on the semiconductor substrate 6 is executed. At this time, together with design data of a selected partial pattern, various parameters for simulation are input. This is defined as step 33 (ST33).

An allowable range is set for the design data selected in step 32. Accordingly, an allowable range is set for design data which is not selected in step 32. Each of the set allowable ranges is compared with a result of the simulation in step 33. More specifically, it is determined whether each of the set allowable ranges falls within an allowance. This is defined as step 34 (ST34). When each of the allowable ranges falls within the allowance obtained by the simulation in step 33, the operation shifts to step 36 described later. To step 34, the same processes as those in step 03-3, step 03-4, step 03-5, and step 03-6 of steps 01 to 03-7 described in FIG. 7 are applied with reference to the first embodiment.

If each of the allowable ranges does not fall within the allowance obtained by the simulation in step 33, the allowable range is considered as an error, and a correcting process is performed such that each of the allowable ranges falls within the allowance. More specifically, the edge portions of the pattern which is selected in step 32 and the pattern which is not selected in step 32 are shifted by predetermined quantities on the design data such that each of the allowable ranges falls within the allowance. More specifically, new allowable ranges are set for the edge portion of the pattern which is selected in step 32 and the edge portion of the pattern which is not selected in step 32. This is defined as step 35 (ST35). Thereafter, on the basis of the design data of the edge portions of the patterns shifted by the predetermined quantities, the simulation in step 33 is performed again. Subsequently, by using step 34 described above, each of the newly set allowable ranges is compared with the result of the simulation in step 33. A loop constituted by step 33, step 34, and step 35 is repeated two or more times until each of the newly set allowable ranges falls within the allowance obtained by the simulation in step 33.

Thereafter, of the design data of the pattern formed on the semiconductor substrate 6, step 32 to step 35 are performed to the design data of the edge portions of all target patterns. More specifically, calculations related to steps 32 to 35 are performed on the design data of all the edge portion of the pattern 5 of the semiconductor integrated circuit to be finally left on the semiconductor substrate 6. It is then determined whether the calculations are performed on the design data of all the edge portions of the pattern 5 of the semiconductor integrated circuit to be finally left on the semiconductor substrate 6. This is defined as step 36 (ST36).

When it is recognized that the calculations related to step 32 to step 35 are performed on the design data of all the edge portions of the pattern 5 of the semiconductor integrated circuit to be finally left on the semiconductor substrate 6, step 31 to step 36 are ended. When it is not recognized that the calculations related to step 32 to step 35 are performed on the design data of all the edge portions of the pattern 5 of the semiconductor integrated circuit to be finally left on the semiconductor substrate 6, this is regarded as an error to cause the operation to return to step 32. Then, the loop constituted by step 32 to step 35 is repeated two or more times until the calculations related to step 32 to step 35 are performed to the design data of all the edge portions of the pattern 5. After the calculations related to step 32 to step 35 are completed with respect to the design data of all the edge portions of the pattern 5 of the semiconductor integrated circuit to be finally left on the semiconductor substrate 6, on the basis of the calculated results, data for photomask patterns of the mask pattern 3 of the shifter mask 1 and the mask pattern 4 of the trim mask 2 are formed and output.

A mask pattern data correcting apparatus 41 serving as a pattern data correcting apparatus for a semiconductor device according to the embodiment will be described below with reference to FIG. 10. The mask pattern data correcting apparatus 41 executes the mask pattern data correcting method according to the embodiment shown in FIG. 9.

As shown in FIG. 10, the mask pattern data correcting apparatus 41 includes a design data acquiring unit 42, an allowable range setting unit 43, a simulation parameter acquiring unit 44, a simulation unit 45, an allowable range determining unit 46, a pattern edge portion moving unit 47, an output unit 48, and a control unit 49 which controls operations of these units.

Design data of the pattern 5 of the semiconductor integrated circuit is input to the design data acquiring unit 42. An allowable range setting parameter is input to the allowable range setting unit 43. Therewith, design data of an edge portion of a desired pattern selected by the design data acquiring unit 42 among the design data of the pattern 5 of the semiconductor integrated circuit, is input to the allowable range setting unit 43. More specifically, the design data acquiring unit 42 executes step 32 of the pattern data correcting step of the mask pattern shown in FIG. 9. A simulation parameter is input to the simulation parameter acquiring unit 44. The simulation unit 45 executes step 33 of the pattern data correcting step of the mask pattern shown in FIG. 9. The allowable range determining unit 46 determines whether a difference which is a comparison result between the result of the simulation performed by the simulation unit 45 and an allowable range of a target set by the allowable range setting unit 43 falls within an allowance. More specifically, the allowable range determining unit 46 and the allowable range setting unit 43 execute step 29 of the pattern data correcting step of the mask pattern shown in FIG. 9.

The pattern edge portion moving unit 47 moves the edge portion of the pattern which does not fall within the allowance by a predetermined quantity on the design data such that the allowable range of the edge portion of the pattern which does not fall within the allowance is caused to fall within the allowance. More specifically, a new allowable range is set for the design data of the edge portion of the pattern the allowable range of which does not fall within the allowance such that the allowable range falls within the allowance. Therefore, the pattern edge portion moving unit 47 executes step 35 of the pattern data correcting step of the mask pattern shown in FIG. 9. After the processes related to step 32 to step 35 of the pattern data correcting step of the mask pattern shown in FIG. 9 are completed with respect to the design data of all the edge portions of the pattern 5 of the semiconductor integrated circuit to be finally left on the semiconductor substrate 6, on the basis of the result, the output unit 48 forms and outputs data for photomask patterns of the mask pattern 3 of the shifter mask 1 and the mask pattern 4 of the trim mask 2.

The control unit 49 determines whether calculations related to step 32 to step 35 of the pattern data correcting step of the mask pattern shown in FIG. 9 are completed with respect to the design data of all the edge portions of the pattern 5 of the semiconductor integrated circuit to be finally left on the semiconductor substrate 6. More specifically, the control unit 49 executes step 36 of the data correcting step for the mask pattern shown in FIG. 9. Therewith, the control unit 49 controls the operations of the design data acquiring unit 42, the allowable range setting unit 43, the simulation parameter acquiring unit 44, the simulation unit 45, the allowable range determining unit 46, the pattern edge portion moving unit 47, and the output unit 48 such that step 32 to step 35 related to the data correcting step of the mask pattern shown in FIG. 9 are properly performed. More specifically, the control unit 49 controls the operations such that the mask pattern data correcting apparatus 41 appropriately functions.

As described above, according to the third embodiment, the same effects as those in the first and second embodiment can be obtained. In the conventional technique, the same allowable error is uniformly set for the edge portions of all the patterns formed on the semiconductor substrate. For this reason, even though the allowable error has an appropriate size for a gate of a transistor finally left on a semiconductor substrate, the size of the allowable error may be frequently excessively strict for the edge portion of the pattern which is not finally left on the semiconductor substrate. A correcting process to satisfy the excessively strict allowable error causes various drawbacks such as increased time for the correcting process. More specifically, along with improvement of accuracy of a pattern formed on a semiconductor substrate, a throughput in the entire lithography step easily decreases. Therefore, in the conventional technique, the improvement of accuracy of the pattern formed on the semiconductor substrate and shortening of time for the throughput in the entire lithography step are a trade-off.

In contrast to this, in the mask pattern data correcting method and the mask pattern data correcting apparatus according to the embodiment, as described above, some of the steps of the mask pattern data verification method according to the first embodiment are used. In this manner, an appropriate allowable range of the size or shape of a pattern actually formed on the semiconductor substrate 6 with respect to the size or shape of an ideal pattern in the design phase can be accurately set without the risk of decreasing a throughput in the lithography step. In this manner, the pattern 5 of a desired semiconductor integrated circuit or the like can be efficiently and accurately formed on the semiconductor substrate 6. Therefore, according to the embodiment, in the lithography step using at least two masks, the shifter mask 1 and the trim mask 2, there can be provided a mask pattern data correcting method and a mask pattern data correcting apparatus which can appropriately and easily determine, by using simulation, whether an allowable error for design data of a pattern to be formed falls within an appropriate allowance and which can set the allowable error within an appropriate range.

Fourth Embodiment

Figure 11:
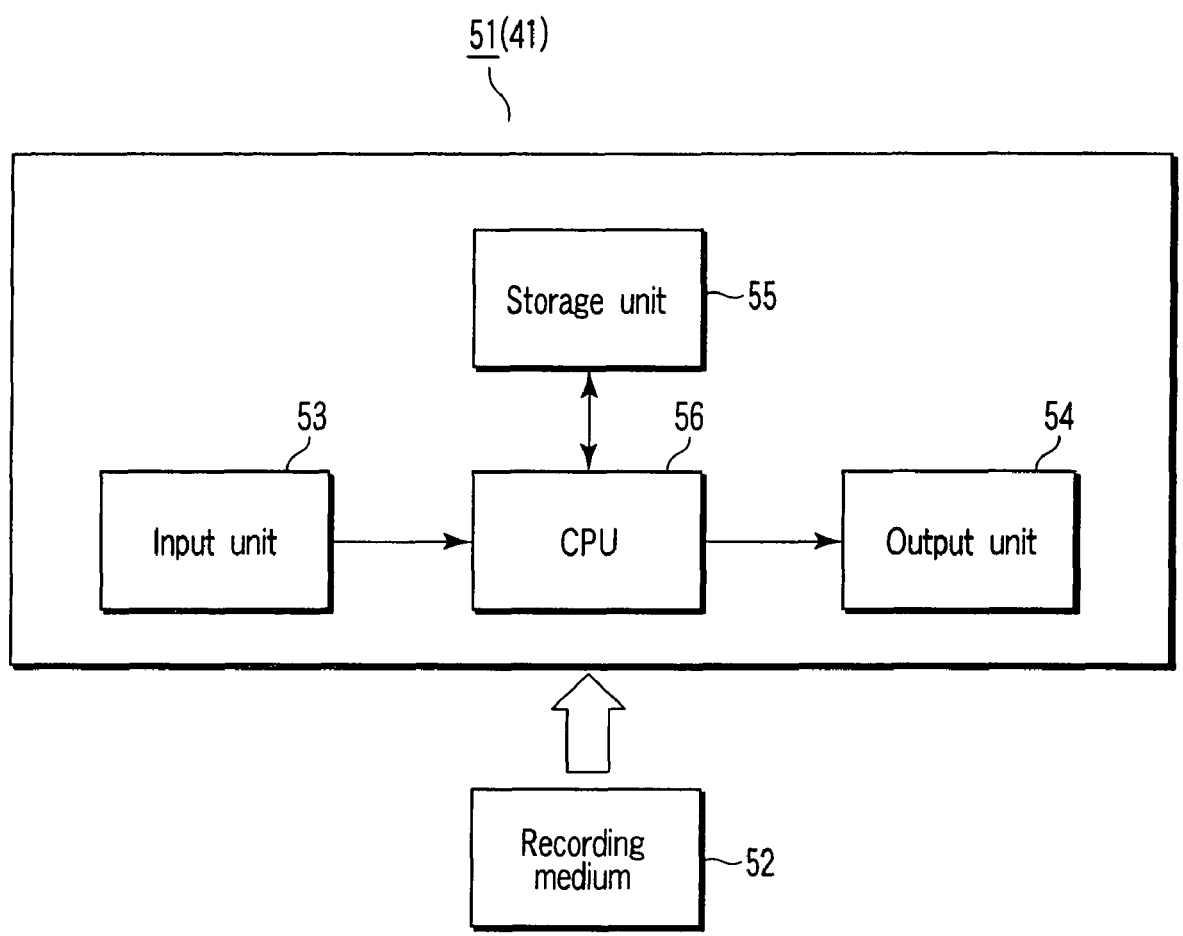
FIG. 11 is a block diagram briefly showing a relationship among a pattern data verification program for a semiconductor device according to a fourth embodiment, a computer-readable recording medium having a pattern data correcting program for a semiconductor device recorded, and a pattern data correcting apparatus for a semiconductor device shown in FIG. 10.

A fourth embodiment according to the present invention will be described below with reference to FIG. 11. FIG. 11 is a block diagram briefly showing a relationship among a pattern data verification program for a semiconductor device according to the embodiment, a computer-readable recording medium having the pattern data correcting program for a semiconductor device recorded, and the pattern data correcting apparatus for a semiconductor device shown in FIG. 10 used as a reference in the third embodiment. The same reference numerals as those in the first to third embodiments denote the same parts as in the fourth embodiment, and a detailed description thereof will be omitted.

In the embodiment, a mask pattern data correcting program serving as a pattern data correcting program for a semiconductor device and a recording medium 52 on which the data correcting program is recorded and which can be read by a computer 51 will be described. The data correcting program and the recording medium 52 execute the mask pattern data correcting method according to the third embodiment described above. More specifically, the data correcting program and the recording medium 52 according to the embodiment operate a mask pattern data correcting apparatus 41 for a semiconductor device serving as the mask pattern data correcting apparatus shown in FIG. 10 used as a reference in the third embodiment and control the operation of the mask pattern data correcting apparatus 41 to execute the mask pattern data correcting method shown in FIG. 9.

As described above, the mask pattern data correcting method constituted by step 31 to step 36 shown in FIG. 9 is substantially constituted by data processing steps all of which can be performed by the computer 51. The mask pattern data correcting method shown in FIG. 9 can also be realized by the computer 51 which loads the mask pattern data correcting program according to the embodiment recorded on the recording medium 52 such as a magnetic disk, an optical disk, or a semiconductor memory and the operation of which is controlled by the loaded program. As a matter of course, the mask pattern data correcting apparatus 41 shown in FIG. 10 is also realized by the computer 51 which loads the mask pattern data correcting program according to the embodiment recorded on the recording medium 52 and the operation of which is controlled by the loaded program. Therefore, the data correcting method shown in FIG. 9 is also executed by the mask pattern data correcting apparatus 41 realized by the computer 51 which loads the mask pattern data correcting program according to the embodiment recorded on the recording medium 52 and the operation of which is controlled by the loaded program.

Therefore, the following description will be made assuming that the mask pattern data correcting apparatus 41 shown in FIG. 10 is the computer 51. In FIG. 11, input units, output units, storage units, and arithmetic processing units of a design data acquiring unit 42, an allowable range setting unit 43, a simulation parameter acquiring unit 44, a simulation unit 45, an allowable range determining unit 46, a pattern edge portion moving unit 47, an output unit 48, and a control unit 49 included in the mask pattern data correcting apparatus 41 are representatively shown as an input unit 53, an output unit 54, a storage unit 55, and a CPU 56 of the computer 51. The CPU 56 serving as an arithmetic processing unit is also called a data processing unit or a program executing unit.

As indicated by an outline arrow in FIG. 11, the mask pattern data correcting program recorded on the recording medium 52 is loaded on the computer 51. More specifically, the mask pattern data correcting program recorded on the recording medium 52 is read by the CPU 56 of the computer 51 through the input unit 53 of the computer 51. The data correcting program read by the CPU 56 is sent from the CPU 56 to the storage unit 55 of the computer 51 and stored in the storage unit 55. Thereafter, the CPU 56 appropriately operates the computer 51 on the basis of the data correcting program stored in the storage unit 55 such that the mask pattern data correcting method shown in FIG. 9 is appropriately executed by the mask pattern data correcting apparatus 41 shown in FIG. 10 as described above. The processing result obtained by the computer 51 is output through the output unit 54. More specifically, the mask pattern data correcting method according to the embodiment is appropriately executed by the design data acquiring unit 42, the allowable range setting unit 43, the simulation parameter acquiring unit 44, the simulation unit 45, the allowable range determining unit 46, the pattern edge portion moving unit 47, the output unit 48, and the control unit 49 included in the mask pattern data correcting apparatus 41.

The method described in the embodiment can also be written in the recording medium 52 such as a magnetic disk, for example, a flexible disk or a hard disk, an optical disk, for example, a CD, a DVD, or an MO, or a semiconductor memory, as a program which can be executed by the computer 51 and applied to various devices or can be transmitted through a communication medium and applied to various devices. The computer 51 which realizes the mask pattern data correcting apparatus 41 described above loads the mask pattern data correcting program recorded on the various recording media 52. The operation of the computer 51 is controlled by the data correcting program to execute the above processes. Also as the storage unit 55 of the computer 51, it is preferable to use a recording medium or a storage device such as a magnetic disk, for example, a flexible disk or a hard disk, an optical disk, for example, a CD, a DVD, or an MO, or a semiconductor memory in which data or a program recorded therein can be arbitrarily rewritten or updated.

As described above, according to the fourth embodiment, the same effects as those in the first to third embodiments can be obtained.

Fifth Embodiment

A fifth embodiment according to the present invention will be described below without a drawing.

In the embodiment, a method of manufacturing a semiconductor device using a technique related to at least one of the first to fourth embodiments will be described.

By using a technique related to at least one of the first to fourth embodiments described above, a pattern 5 caused to be finally left on a semiconductor substrate 6 is formed on the semiconductor substrate 6. Thereafter, although a concrete and detailed description with a drawing will be omitted, the semiconductor substrate 6 on which the pattern 5 has been formed is caused to flow to other pre-processes such as transistor manufacturing steps and interconnection forming steps. Subsequently, the semiconductor substrate 6 having undergone the pre-processes is caused to flow to post-processes such as dicing, chip mounting, bonding, and molding. After the semiconductor substrate 6 has undergone the post-processes, a desired semiconductor device (not shown) according to the embodiment is obtained.

As described above, according to the fifth embodiment, a technique related to at least one of the first to fourth embodiments is used. In this manner, various semiconductor elements, interconnections, and the like can be accurately and efficiently formed on the semiconductor substrate 6. Therefore, it is possible to efficiently produce a semiconductor device which is improved in performance, reliability, quality and the like.

The pattern data verification method for a semiconductor device, the pattern data verification program for a semiconductor device, the pattern data correcting method for a semiconductor device, the pattern data correcting program for a semiconductor device, and the method of manufacturing a semiconductor device according to the present invention are not limited to the first to fifth embodiments described above. The methods and the programs can be executed such that the configurations or the manufacturing steps can be partially changed into various settings, or the various settings are arbitrarily and properly combined to each other and used without departing from the spirit and scope of the invention.

For example, each of the shifter masks 1, 21, and 23 has a plurality of first openings 7 each having a phase of about 0° and a plurality of second openings 8 each having a phase of about 180°. However, the present invention is not limited to this configuration. In the shifter mask, four types of openings having phases of about 0°, about 90°, about 180°, and about 270° which are different from each other by 90° each may be formed. In each shifter mask, at least one each of at least two types of openings having phases set at different values depending on an exposure condition or the like may be formed.

In the first to fourth embodiments, when an allowable range is out of an allowance, the allowable range is regarded as an error, and data is modified such that the allowable range falls within the allowance, or the data is corrected. However, the present invention is not limited to this configuration. When the techniques according to the first to fourth embodiments are used, a pattern of a photomask can be formed on the basis of design data including an error, and the pattern including the error can also be used as a monitoring pattern used when a fluctuation of processes on the semiconductor substrate 6 is monitored.

The process simulations performed in the first to fourth embodiments may include optical image calculations.

An allowable range or an allowable error, set in each of the first to fourth embodiments, for design data of an extracted pattern may be defined on the basis of a coefficient of fluctuation to a desired size on the semiconductor substrate 6 or a ratio to a design rule minimum. Therewith, the allowable range or the allowable error, set in each of the first to fourth embodiments, for the design data of the extracted pattern may be set in consideration of circuit information extracted from integrated circuit pattern data, for example, whether the pattern is for a gate, whether the pattern is for an interconnection, or the presence/absence of a contact hole.

An allowable range or an allowable error, set in each of the first to fourth embodiments, for design data of a pattern which is not extracted may be defined as a range in which an edge portion finally formed on the semiconductor substrate 6 is not formed, even though a variation of a pattern shape which can be obtained by a fluctuation in process is considered.

In the second embodiment, when an allowable range is set, arrangement information related to phases or transmittances included in design data of the openings 7 and 8 formed in the shifter masks 21 and 23 is acquired and used in simulation. However, the present invention is not limited to this configuration. When the simulation is executed on the basis of the arrangement information related to the acquired phases or transmittances, an allowable error including a variation of the design data of the mask pattern 22 and 24 which can be generated when the mask patterns 22 and 24 are exposed and transferred onto the semiconductor substrate 6 may be included as a parameter.

Furthermore, in the first and third embodiments, the design data of the edge portion of the pattern 5 of the semiconductor integrated circuit finally left on the semiconductor substrate 6 is selected and extracted from each of the design data of the mask pattern 3 of the shifter mask 1 and the design data of the mask pattern 4 of the trim mask 2. However, the present invention is not limited to this configuration. As the data selected and extracted from the design data of the photomask patterns 3 and 4, design data of an edge portion of a pattern which is not finally left on the semiconductor substrate 6 may be selected and extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern data verification method for a semiconductor device, comprising:
   extracting, using a computer, from design data, design data corresponding to an edge portion of a mask pattern to obtain an edge portion of a pattern on a substrate to be processed, when the pattern is obtained on the substrate to be processed by using at least two masks each having the mask pattern corresponding to the design data;
   setting different allowable errors with respect to the extracted design data and the design data which is not extracted, respectively, each of the allowable errors corresponding to an allowable range of a size of a pattern actually formed on a substrate with respect to a size of an ideal pattern in the design data;
   calculating a pattern formed on the substrate to be processed by using at least one mask by process simulation; and
   comparing an error between the pattern calculated by the simulation and the design data with the allowable error set for the design data,
   wherein a plurality of portions which are different from one another in at least one of phase and transmittance are included in the design data corresponding to the mask pattern formed on at least one of the masks, and arrangement information of said each portion in the design data is acquired from the design data of the mask pattern, and
   an allowable error including a variation of the design data of the mask pattern which is generated when the mask pattern is formed on the substrate to be processed is calculated based on the arrangement information.

2. The method according to claim 1, wherein an allowable error for the design data corresponding to a portion which need not be left on the substrate to be processed in the pattern formed on the substrate to be processed and an allowable error for the design data corresponding to a portion which must be left on the substrate to be processed are set to have different sizes.

3. The method according to claim 1, wherein an allowable error for the design data corresponding to a portion which need not be left on the substrate to be processed in the pattern formed on the substrate to be processed is set to be more moderate than an allowable error for the design data corresponding to a portion which must be left on the substrate to be processed.

4. The method according to claim 1, wherein at least one opening which exposes a portion which need not be left on the substrate to be processed is formed in at least one of the masks.

5. The method according to claim 1, wherein as said at least two masks, a phase shift mask in which at least one each of at least two types of openings being different from each other in phase is formed and a trim mask which shapes a pattern formed by using the phase shift mask into a predetermined shape are used.

6. The method according to claim 5, wherein a phase difference between at least two openings of the openings formed in the phase shift mask is set at 180°.

7. The method according to claim 5, wherein an edge portion of the pattern formed by using the phase shift mask is located in a region exposed by the trim mask.

8. The method according to claim 5, wherein an allowable error for the design data corresponding to the edge portion of the pattern left on the substrate to be processed is set on the basis of a design rule for an object left on the substrate to be processed in the pattern formed by using the phase shift mask.

9. The method according to claim 5, wherein allowable errors for the design data corresponding to the edge portion of the pattern left on the substrate to be processed are independently set depending on design rules of pieces of circuit information formed on the substrate to be processed.

10. The method according to claim 5, wherein an allowable error for the design data corresponding to the edge portion of the pattern left on the substrate to be processed is set in consideration of a variation in size of the edge portion and a superposing margin obtained by the phase shift mask and the trim mask.

11. The method according to claim 5, wherein an allowable error for the design data corresponding to a portion which need not be left on the substrate to be processed in the pattern formed on the substrate to be processed is set as an interval between the edge portion of said each opening formed in the phase shift mask and an edge portion of the trim mask.

12. The method according to claim 5, wherein as an allowable error for a pattern formed on the substrate to be processed, an allowable error for a pattern corresponding to a portion between openings having equal phases of the openings formed in the phase shift mask is set to be more moderate than an allowable error for a pattern corresponding to a portion between openings having different phases.

13. A computer-readable recording medium having a pattern data verification program for a semiconductor device recorded, the pattern data verification program for the semiconductor device causing a computer to execute:
   a process of extracting design data using a computer, the design data corresponding to an edge portion of any one of a portion which must be left on a substrate to be processed and a portion which need not be left on the substrate to be processed in a pattern formed on the substrate to be processed by using at least two masks from design data corresponding to mask patterns respectively formed on the masks;
   a process of setting different allowable errors with respect to the extracted design data and the design data which is not extracted, respectively, each of the allowable errors corresponding to an allowable range of a size of a pattern actually formed on a substrate with respect to a size of an ideal pattern in the design data;
   a process of executing process simulation to form the pattern on the substrate to be processed on the basis of the design data of the mask pattern formed on at least one of the masks; and
   a process of comparing a result of the simulation with said each allowable error
   wherein a plurality of portions which are different from one another in at least one of phase and transmittance are included in the design data corresponding to the mask pattern formed on at least one of the masks, and arrangement information of said each portion in the design data is acquired from the design data of the mask pattern, and
   an allowable error including a variation of the design data of the mask pattern which is generated when the mask pattern is formed on the substrate to be processed is calculated based on the arrangement information.

14. A method of manufacturing a semiconductor device comprising:
   extracting using a computer, from design data, design data corresponding to an edge portion of a mask pattern to obtain an edge portion of a pattern on a substrate to be processed, when the pattern is obtained on the substrate to be processed by using at least two masks each having the mask pattern corresponding to the design data;
   setting different allowable errors with respect to the extracted design data and the design data which is not extracted, respectively, each of the allowable errors corresponding to an allowable range of a size of a pattern actually formed on a substrate with respect to a size of an ideal pattern in the design data;
   calculating a pattern formed on the substrate to be processed by using at least one mask by process simulation;
   comparing an error between the pattern calculated by the simulation and the design data with the allowable error set for the design data;
   wherein a plurality of portions which are different from one another in at least one of phase and transmittance are included in the design data corresponding to the mask pattern formed on at least one of the masks, and arrangement information of said each portion in the design data is acquired from the design data of the mask pattern, and
   an allowable error including a variation of the design data of the mask pattern which is generated when the mask pattern is formed on the substrate to be processed is calculated based on the arrangement information
   when at least a part of the pattern calculated by the simulation is out of a range of said each allowable error, extracting the design data corresponding to the pattern being out of the range of said each allowable error;
   performing correction to the extracted design data corresponding to the pattern being out of the range of said each allowable error to set the design data within the range of said each allowable error;
   forming said each mask pattern on said each mask on the basis of the design data corresponding to the pattern falling within the range of said each allowable error as a result of the simulation and the design data corresponding to the pattern falling within the range of said each allowable error by the correction; and
   exposing and transferring said each mask pattern onto the substrate to be processed by using said each mask.

* * * * *

UNITED STATES PATENT AND TRADEMARK OFFICE
CERTIFICATE OF CORRECTION

PATENT NO. : 7,730,445 B2  Page 1 of 1
APPLICATION NO. : 11/798725
DATED : June 1, 2010
INVENTOR(S) : Nojima It is certified that error appears in the above-identified patent and that said Letters Patent is hereby corrected as shown below:

Claim 13, column 23, line 14, change "data using" to --data, using--.

Claim 13, column 23, line 33, change "error" to --error,--.

Claim 14, column 24, line 1, change "extracting using" to --extracting, using--.

Claim 14, column 24, line 17, change "data;" to --data,--.

Claim 14, column 24, line 27, change "information" to --information;--.

Signed and Sealed this

Seventeenth Day of August, 2010

David J. Kappos
*Director of the United States Patent and Trademark Office*